United States Patent
Chen et al.

(10) Patent No.: US 6,472,822 B1
(45) Date of Patent: Oct. 29, 2002

(54) PULSED RF POWER DELIVERY FOR PLASMA PROCESSING

(75) Inventors: Jin-Yuan Chen, Bountiful, UT (US); John P. Holland, San Jose, CA (US); Arthur H. Sato, San Jose, CA (US); Valentin N. Todorow, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/560,108

(22) Filed: Apr. 28, 2000

(51) Int. Cl.[7] .................................. H05H 1/46
(52) U.S. Cl. ................... 315/111.21; 333/99 PL
(58) Field of Search .................. 315/111.21, 111.51, 315/111.71; 333/17.1, 17.3, 99 PL; 204/155; 422/906; 427/569, 570

(56) References Cited

U.S. PATENT DOCUMENTS

| | | | |
|---|---|---|---|
| 3,677,799 A | | 7/1972 | Hou .................... 117/93.1 R |
| 4,629,940 A | * | 12/1986 | Gagne et al. ........... 315/111.51 |
| 4,808,258 A | | 2/1989 | Otsubo et al. .............. 156/643 |
| 4,863,549 A | | 9/1989 | Grünwald .................... 156/345 |
| 4,891,118 A | | 1/1990 | Ooiwa et al. ................ 204/298 |
| 5,087,857 A | | 2/1992 | Ahn ....................... 315/111.21 |
| 5,179,264 A | * | 1/1993 | Cuomo et al. ........... 219/121.43 |
| 5,362,358 A | * | 11/1994 | Yamagata et al. .......... 156/643 |
| 5,424,691 A | * | 6/1995 | Sadinsky ................... 333/17.3 |
| 5,562,952 A | | 10/1996 | Nakahigashi et al. ........ 427/534 |
| 5,654,679 A | | 8/1997 | Mavretic et al. ........... 333/17.3 |
| 5,842,154 A | * | 11/1998 | Harnett ..................... 333/17.3 |
| 5,844,369 A | * | 12/1998 | Yoshizako et al. ...... 315/111.21 |
| 5,859,501 A | * | 1/1999 | Chi ....................... 315/111.21 |
| 5,929,717 A | * | 7/1999 | Richardson et al. .... 315/111.21 |
| 6,020,794 A | * | 2/2000 | Wilbur ...................... 333/17.1 |
| 6,060,837 A | * | 5/2000 | Richardson et al. .... 315/111.51 |

FOREIGN PATENT DOCUMENTS

| | | |
|---|---|---|
| JP | 05156452 | 6/1993 |
| JP | 07183236 | 7/1995 |
| WO | WO 99/14699 A1 | 3/1999 |

* cited by examiner

*Primary Examiner*—Don Wong
*Assistant Examiner*—Thuy Vinh Tran
(74) *Attorney, Agent, or Firm*—Townsend, Townsend and Crew; Joseph Bach

(57) ABSTRACT

A system and method for overcoming the above-described problems relating to the delivery of pulsed RF power to a plasma processing chamber. The power reflected from the chamber is reduced using one or more of the following techniques: (1) varying the RF frequency within a pulse period; (2) ramping up the pulse heights at the leading edge of the pulse train; (3) simultaneously transmitting a relatively low CW signal along with the pulsed signal; and (4) rapidly switching the shunt capacitance within a local matching network within a pulse period. The amount of power delivered to the plasma by the pulses is measured by way of a time-averaging mechanism coupled to a directional coupler connected to the transmission line. The time-averaging mechanism may comprise circuitry to measure temperatures of loads attached to the directional coupler, or analog integrating circuitry attached to the directional coupler, or digital integrating circuitry attached to the directional coupler.

34 Claims, 22 Drawing Sheets

PIN DIODE SWITCH STATES FOR THE BINARY CODED AND LINEAR CAPACITANCE BANKS

| | 5 BIT BCD CAPACITANCE BANK | | | | | 5 POSITION LINEAR CAPACITANCE BANK LEVELS | | | |
|---|---|---|---|---|---|---|---|---|---|
| | BLANK = OPEN, 1 = CLOSED | | | | | BLANK = OPEN, 1 = CLOSED | | | |
| | EXPONENT, $2^n$ | | | | | | | | |
| | 4 | 3 | 2 | 1 | 0 | | | | |
| | BIT | | | | | SWITCH | | | |
| LEVEL | 5 | 4 | 3 | 2 | 1 | 4 | 3 | 2 | 1 |
| 0 | | | | | | | | | |
| 1 | | | | | 1 | | | | |
| 2 | | | | 1 | | | | | |
| 3 | | | | 1 | 1 | | | | |
| 4 | | | 1 | | | | | | |
| 5 | | | 1 | | 1 | | | | |
| 6 | | | 1 | 1 | | | | | |
| 7 | | | 1 | 1 | 1 | | | | |
| 8 | | 1 | | | | | | | 1 |
| 9 | | 1 | | | 1 | | | | |
| 10 | | 1 | | 1 | | | | | |
| 11 | | 1 | | 1 | 1 | | | | |
| 12 | | 1 | 1 | | | | | | |
| 13 | | 1 | 1 | | 1 | | | | |
| 14 | | 1 | 1 | 1 | | | | | |
| 15 | | 1 | 1 | 1 | 1 | | | | |
| 16 | 1 | | | | | | | 1 | 1 |
| 17 | 1 | | | | 1 | | | | |
| 18 | 1 | | | 1 | | | | | |
| 19 | 1 | | | 1 | 1 | | | | |
| 20 | 1 | | 1 | | | | | | |
| 21 | 1 | | 1 | | 1 | | | | |
| 22 | 1 | | 1 | 1 | | | | | |
| 23 | 1 | | 1 | 1 | 1 | | | | |
| 24 | 1 | 1 | | | | | 1 | 1 | 1 |
| 25 | 1 | 1 | | | 1 | | | | |
| 26 | 1 | 1 | | 1 | | | | | |
| 27 | 1 | 1 | | 1 | 1 | | | | |
| 28 | 1 | 1 | 1 | | | | | | |
| 29 | 1 | 1 | 1 | | 1 | | | | |
| 30 | 1 | 1 | 1 | 1 | | | | | |
| 31 | 1 | 1 | 1 | 1 | 1 | | | | |
| 32 | | | | | | 1 | 1 | 1 | 1 |

*FIG. 17.*

PULSED RF POWER DELIVERY FOR PLASMA PROCESSING

BACKGROUND OF THE INVENTION

The present invention relates to semiconductor manufacturing equipment. More particularly, the present invention relates to a system and method for delivering pulsed radio frequency (RF) power to a plasma processing chamber. A plasma processing chamber may be used for dry etching, or plasma-assisted deposition, or other processes.

One embodiment of the present invention relates to a system and method for delivering pulsed RF power to a dry etching chamber. Dry etching basically involves exposing a semiconductor wafer to an electrical discharge and a reactive gas at the same time. Dry etching includes plasma etching, reactive ion etching, and reactive sputtering.

In conventional dry etching, continuous wave (CW) RF power is delivered to the plasma chamber. One problem with using CW RF power for plasma processing is that charge-up damage may occur.

Delivering pulsed power prevents charge from building up and so mitigates charge-up damage effects. Prior art systems for delivering pulsed power include the ones described in U.S. Pat. No. 4,863,549 (Grunwald), U.S. Pat. No. 4,891,118 (Ooiwa et al.), U.S. Pat. No. 5,087,857 (Ahn), and U.S. Pat. No. 5,362,358 (Yamagata et al.). However, the prior art pulsed power systems suffer from various defects and disadvantages.

First, the prior art systems do not address the complex impedance mismatch problem which exists due to the pulsing of the power. Minimizing the amount of power that is reflected back towards the power generator from the processing chamber becomes more difficult for pulsed power. If the reflected power is too high, the generator may be detrimentally driven into foldback.

Second, the prior art systems do not address the complexities and difficulties in accurately measuring power delivered by the pulsed signal. Measuring the amount of energy delivered is needed so that manufacturing processes may be repeated in a highly predictable way.

The delivery process for pulsed RF power is more complex than the delivery process for CW RF power. In the CW case, the load impedance of the plasma chamber evolves in stages including an initial ignition stage when the plasma is ignited, a transient stage as the plasma approaches some steady-state condition, and a steady-state stage at which the plasma maintains the steady-state condition. Conventional CW RF power delivery systems have been designed to drive power into the steady-state plasma at a high level of stability, while merely tolerating the ignition and transient stages. These conventional systems operate on control algorithms with iteration times varying from 100 microseconds to a few milliseconds. Such time scales largely define the limits of temporal variation in load impedances that the conventional systems may compensate so as to deliver a highly stable level of power.

In the stable steady-state condition, the CW power transfer into the chamber is defined by only one impedance value and two voltage levels, where the impedance value corresponds to the impedance of the transmission line connecting the generator and chamber, and the two voltages corresponds to the amplitude of the forward and reflected voltage waves traveling on the transmission line. Reflected power is minimized by fixing degrees of freedom in the local matching circuit such that the transmission line impedance is matched during the steady-state condition, and the power transfer may be characterized with only the steady state impedance and two voltage amplitude measurements (forward and reflected amplitudes).

In contrast, in the pulsed case, the load impedance of the plasma chamber has no steady-state behavior. This lack of steady-state behavior significantly increases the complexity of the situation. The load impedance is repeatedly cycling from a value near ignition to a terminal value which can be held for as short a time as a few microseconds. Hence, the power delivery system must deal with transient conditions, instead of steady-state conditions. Conventional CW power delivery systems are not equipped to deal with such transient conditions.

In particular, the load impedance varies in time, so more is needed than fixing the local match's degrees of freedom in the local matching circuit. In order to deal with the cycling of the local impedance, determinations must be made on which degrees of freedom are available to be varied, how to control the degrees of freedom to accomplish such variation, and how to vary the degrees of freedom to minimize reflected power. In addition, the voltage amplitudes of the forward and reflected power waves vary in time, so simple measurements of voltage amplitudes do not yield an accurate measure of the power transmitted.

SUMMARY OF THE INVENTION

The present invention provides a system and method for overcoming the above-described problems relating to the delivery of pulsed RF power to a plasma processing chamber. The power reflected from the chamber is reduced using one or more of the following techniques: (1) varying the RF frequency within a pulse period; (2) ramping up the pulse heights at the leading edge of the pulse train; (3) simultaneously transmitting a relatively low CW signal along with the pulsed signal; and (4) rapidly switching the shunt capacitance within a local matching network within a pulse period. The amount of power delivered to the plasma by the pulses is measured by way of a time-averaging mechanism coupled to a directional coupler connected to the transmission line. The time-averaging mechanism may comprise circuitry to measure temperatures of loads attached to the directional coupler, or analog integrating circuitry attached to the directional coupler, or digital integrating circuitry attached to the directional coupler.

In accordance with a first aspect of the present invention, a method for delivering RF power to a plasma comprises: generating a RF oscillation having a frequency and an amplitude; modulating the frequency of the RF oscillation; modulating the amplitude of the RF oscillation; amplifying the RF oscillation; and transmitting the RF oscillation to the plasma. In one embodiment of this aspect, a method for delivering pulsed RF power to a plasma comprises: generating a pulse train comprising a series of pulses, each pulse being characterized by a pulse period; generating a frequency-varied RF oscillation which varies in frequency within the pulse period; modulating the frequency-varied RF oscillation with the pulse train to generate a frequency-varied pulsed RF signal; and transmitting the frequency-varied pulsed RF signal to the plasma.

In accordance with a second aspect of the present invention, a method for delivering pulsed radio frequency (RF) power to a plasma comprises: generating a RF oscillation; generating a pulse train comprising a series of pulses, each pulse being characterized by a pulse height; varying the pulse height from pulse to pulse in the pulse train to form a pulse train having varied pulse heights; modulating the RF oscillation with the pulse train having varied pulse heights to form a pulsed RF signal having varied pulse heights; and transmitting the pulsed RF signal having varied pulse heights to the plasma.

In accordance with a third aspect of the present invention, a method for delivering pulsed radio frequency (RF) power to a plasma comprises: generating a first continuous wave RF signal and a second continuous wave RF signal; generating a pulse train comprising a series of pulses; modulating the first continuous wave RF signal with the pulse train to form a pulsed RF signal; and transmitting simultaneously both the pulsed RF signal and the second continuous wave RF signal to the plasma.

In accordance with a fourth aspect of the present invention, a method for delivering pulsed RF power to a plasma comprises: transmitting a pulsed RF signal by way of an impedance matching network to the plasma, the pulsed RF signal including a series of pulses, each pulse being characterized by a pulse period; sensing a magnitude error signal related to a magnitude of a reflected signal coming back from the plasma; and utilizing the magnitude error signal for control over a variable shunt capacitor in the impedance matching network, where capacitance of the variable shunt capacitor is varied within the pulse period.

Finally, in accordance with a fifth aspect of the present invention, a system for delivering pulsed radio frequency (RF) power to a plasma and for measuring power absorbed by the plasma comprises: a pulsed RF power generator configured to generate forward RF pulses; a RF cable having a first end coupled to the pulsed RF power generator, the RF cable being adapted to carry the forward RF pulses; a reaction chamber coupled to a second end of the RF cable, the reaction chamber being adapted to contain the plasma and to couple the forward RF pulses to the plasma; a directional coupler coupled to the RF cable, the directional coupler being adapted to generate a first attenuated signal proportional to the forward RF pulses and a second attenuated signal proportional to the backward RF pulses; and a time-averaging mechanism coupled to the directional coupler and adapted to time-average the first attenuated signals to generate a first time-averaged signal and to time-average the second attenuated signal to generate a second time-averaged signal, where the power absorbed by the plasma is proportional to the difference between the first and second time averaged signals.

BRIEF DESCRIPTION OF THE DRAWINGS

FIG. 17 is a table showing PIN diode switch states for binary coded and linear capacitance banks.

DESCRIPTION OF THE SPECIFIC EMBODIMENTS

Figure 1:
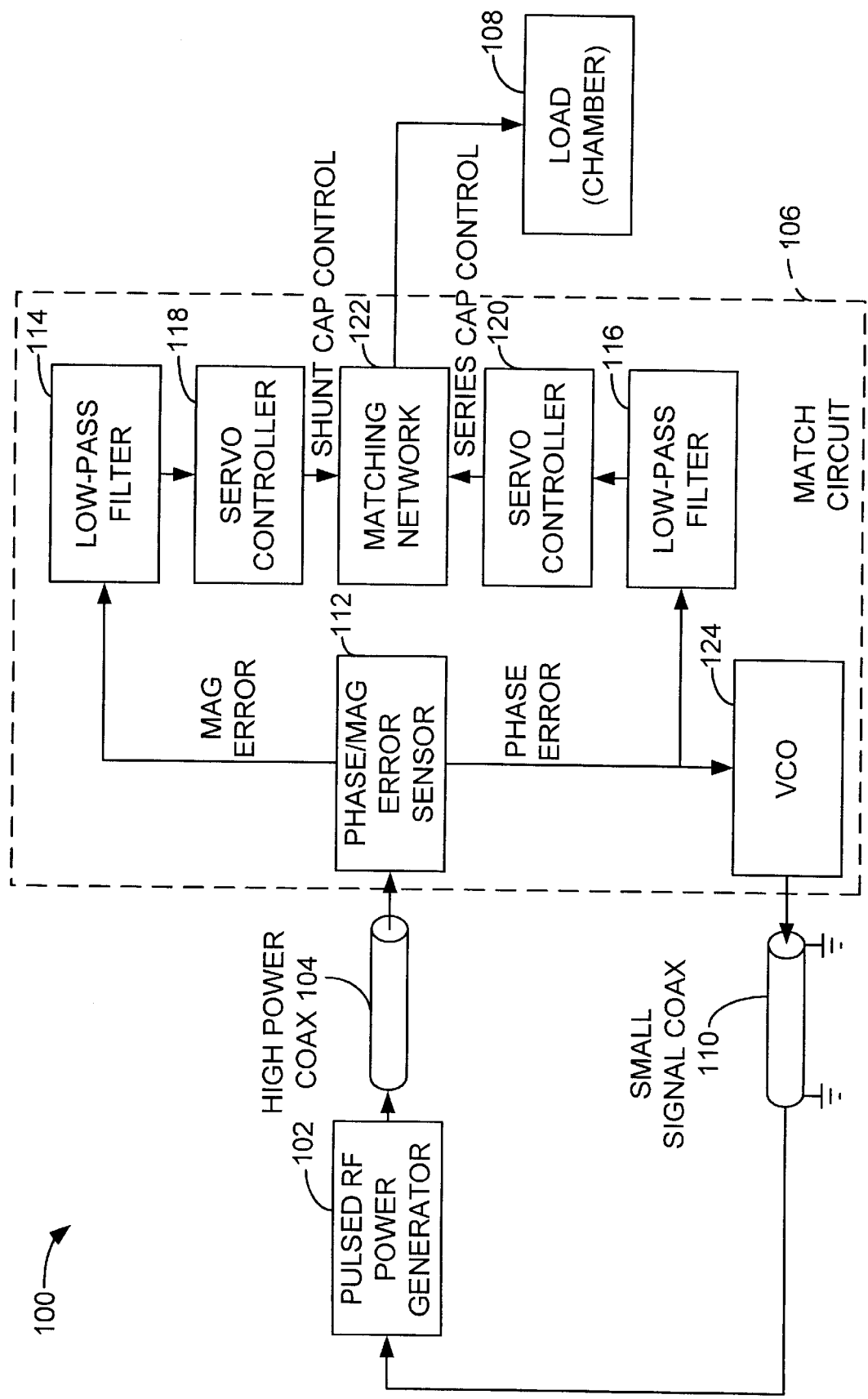
FIG. 1 is a schematic diagram of a pulsed RF power delivery system 100 in accordance with an embodiment of the present invention.

FIG. 1 is a schematic diagram of a pulsed RF power delivery system 100 in accordance with an embodiment of the present invention. The pulsed RF power delivery system 100 includes pulsed RF power generator 102, high power coaxial cable 104, a match circuit 106, a load 108, and a small signal coaxial cable 110.

The pulsed RF power generator 102 generates forward RF pulses to the high power coaxial cable 104. The pulsed RF power generator 102 is described in further detail below in relation to FIG. 2. The high power coaxial cable 104 comprises a transmission line that connects the pulsed RF power generator 102 to the matching circuit 106 which, in turn, connects to the load 108. In a preferred embodiment, the load 108 comprises a plasma reaction chamber. The match circuit 106 also connects to one end of a small signal coaxial cable 110. The other end of the small signal coaxial cable 110 connects back to the RF power generator 102.

The match circuit 106 is further detailed in FIG. 1 and comprises a phase/magnitude error sensor 112, two low-pass filters 114 and 116, two servo controllers 118 and 120, a matching network 122, and a voltage-controlled oscillator (VCO) 124.

The phase/magnitude error sensor 112 produces phase and magnitude error signals. A first low-pass filter 114 receives and filters the magnitude error signal, and a second low-pass filter 116 receives and filters the phase error signal. The first and second low-pass filters 114 and 116 preferably have time constants in the range of 1–10 milliseconds. The first low-pass filter 114 outputs the filtered magnitude error signal to a first servo controller 118, and the second low-pass filter 116 outputs the filtered phase error signal to a second servo controller 120. The first servo controller 118 uses the filtered magnitude error signal to generate and output a shunt capacitance control signal to the matching network 122. The second servo controller 120 uses the filtered phase error signal to generate and output a series capacitance control signal to the matching network 122. The matching network 122 controlled by the servo controllers 118 and 120 is a mechanical matching network 122. Alternatively, a solid-state matching network 122 may be used.

In addition, the phase/magnitude error sensor 112 outputs the phase error signal to the VCO 124. In one embodiment of the present invention, the phase error signal output to the VCO 124 comprises a fast phase error signal which is generated by a separate fast phase error detector. The fast phase error signal may be either unfiltered or filtered by a filter with a time constant on the order of 1 microsecond or less.

As described above in the background section, one problem with using pulsed RF power relates to the difficulties in minimizing the amount of power that is reflected back towards the RF generator 102. In accordance with the present invention, one way to reduce the reflected power involves not using a fixed RF frequency. Instead, the present invention contemplates varying the RF frequency within each pulse to reduce reflected power.

Figure 8:
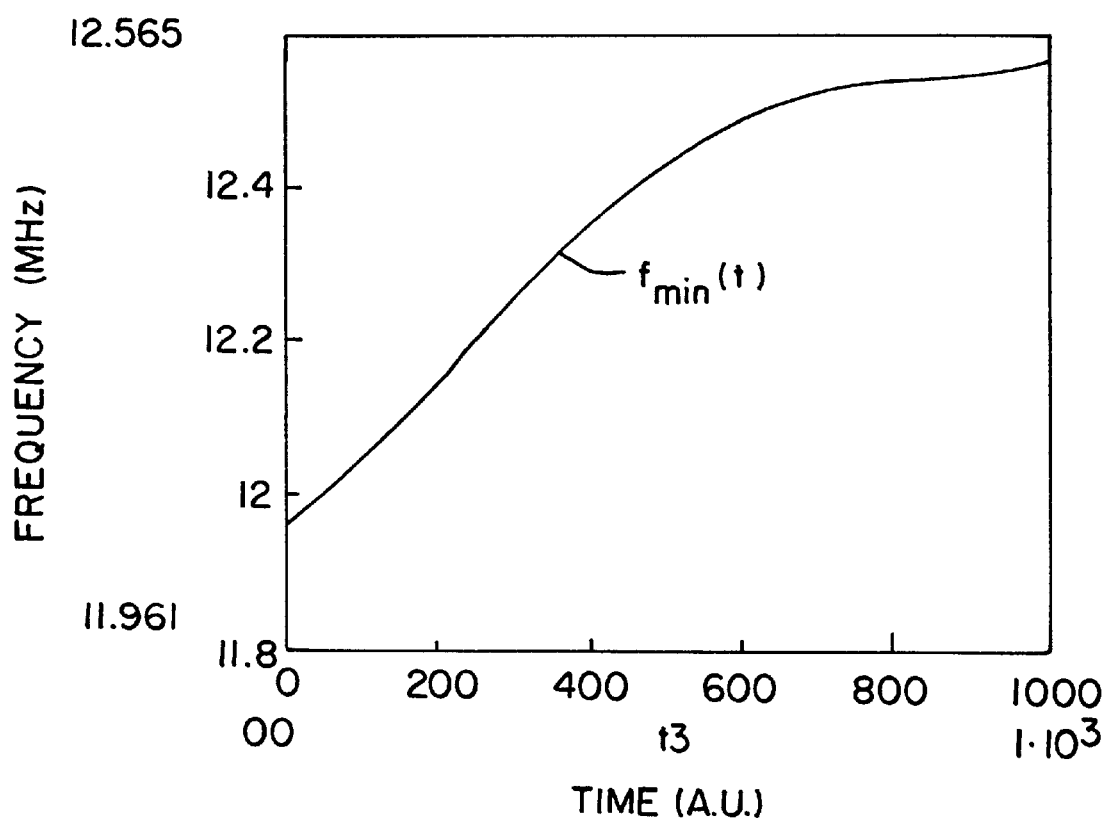
FIG. 8 is a graph showing, according to theoretical calculations, frequency variation within a pulse cycle needed to minimize reflected power.

FIG. 8 is a graph showing, according to theoretical calculations, frequency variation within a pulse cycle needed to minimize reflected power in accordance with the present invention. As shown in FIG. 8, the frequency to achieve minimum reflected power $f_{min}(t)$ varies from less than 12.0 MHz at the start of a single 30 pulse to more than 12.5 MHz nearer to the pulse peak.

Figure 9:
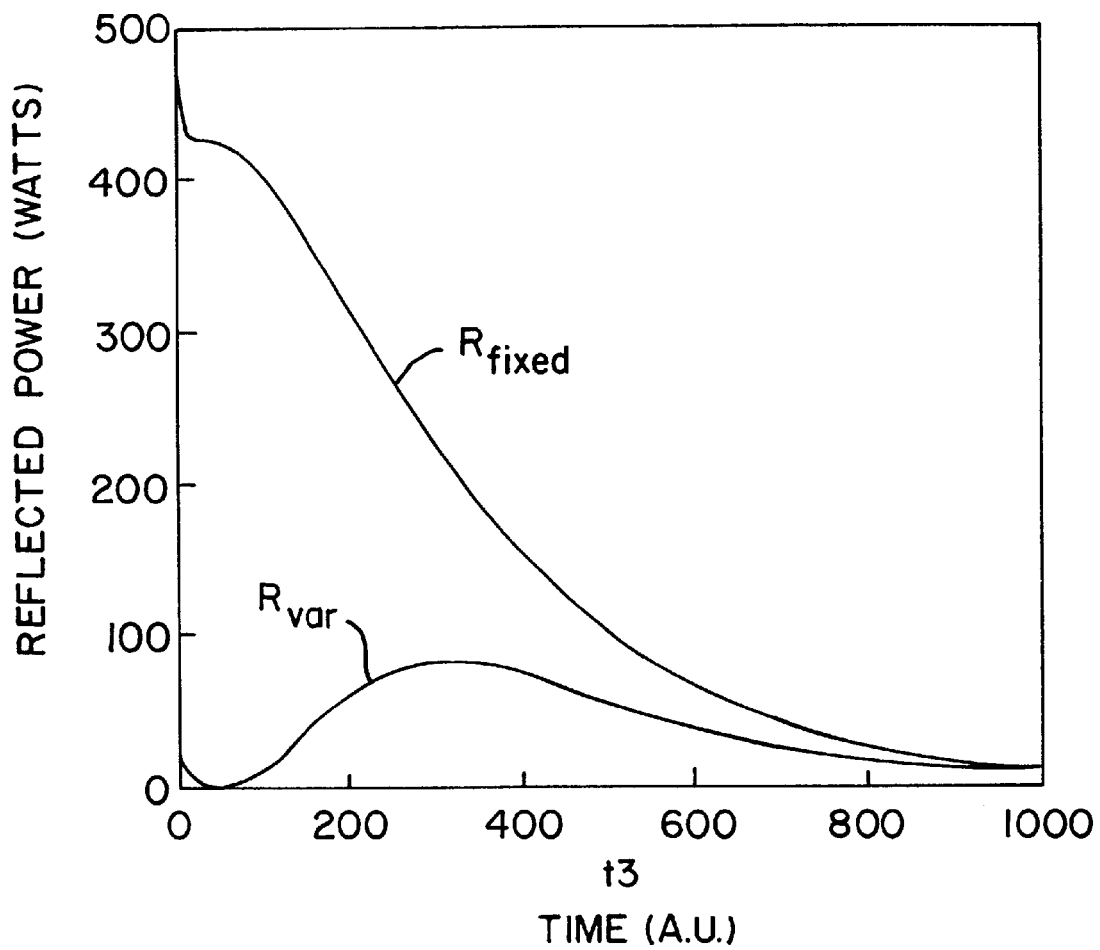
FIG. 9 is a graph showing, according to theoretical calculations, a decrease in reflected power during a pulse cycle when frequency is varied in accordance with the graph in FIG. 12 rather than being fixed.

FIG. 9 is a graph showing, according to theoretical calculations, a decrease in reflected power during a pulse cycle when frequency is varied in accordance with the graph in FIG. 8, rather than being fixed. The reflected power during a pulse cycle when frequency is fixed is given by the $R_{fixed}$ curve. In comparison, the reflected power during a pulse cycle when frequency is varied in accordance with the graph in FIG. 8 is given by the $R_{var}$ curve. The difference between the two curves is the theoretical decrease in reflected power when frequency is varied in accordance with the graph in FIG. 8 rather than being fixed.

As described below, either closed-loop or open-loop frequency control may be used to vary frequency during a pulse cycle such that reflected power is reduced.

The pulsed RF power delivery system 100 as shown in FIG. 1 is configured for closed-loop frequency control. The closed-loop frequency control may be used to vary frequency during a pulse so as to reduce reflected power.

Figure 10:
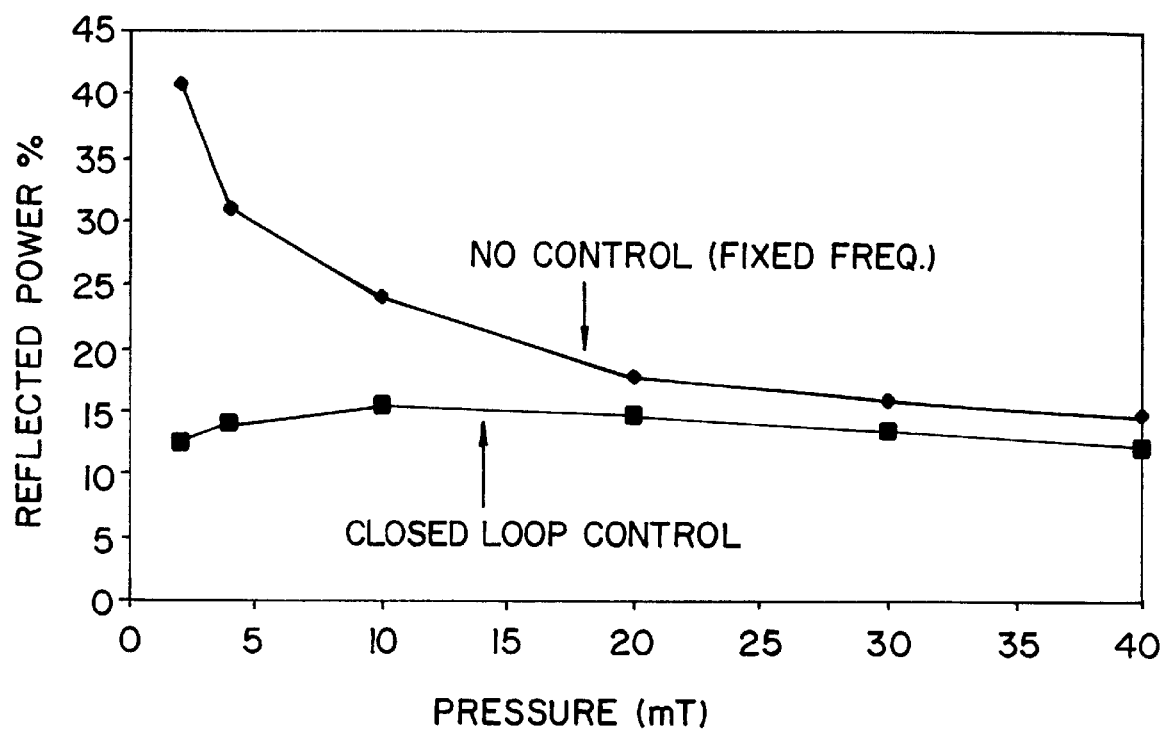
FIG. 10 is a graph of experimental results showing, for a pure $Cl_2$ discharge, a decrease in reflected power during a pulse cycle when frequency is varied by closed loop control rather than being fixed.

Experimental measurements demonstrating reduction in reflected power using closed-loop frequency control are described in relation to FIG. 10. FIG. 10 is a graph of experimental results showing, for a pure $Cl_2$ discharge, a decrease in reflected power when frequency is varied during a pulse cycle by closed loop control rather than being fixed. The conditions associated with the experimental results in FIG. 10 are as follows: 100% $Cl_2$; T (pulse)=80 $\mu$s; on-time= 35 $\mu$s; off-time=45 $\mu$s; and (time averaged) power ~400 w. For the closed loop control, a phase error signal with a time constant of approximately 1 microsecond is used to bias the VCO 124.

In FIG. 10, the percentage reflected power for various $Cl_2$ gas pressures using fixed 12.56 MHz frequency pulses is shown by the upper data points, and the percentage reflected power for various $Cl_2$ gas pressures using closed-loop frequency control is shown by the lower data points. For all $Cl_2$ gas pressures shown, the percentage reflected power is always lower when using closed-loop frequency control rather than a fixed frequency.

In an alternate embodiment of the present invention, the pulsed RF delivery system 100 shown in FIG. 1 may be modified to use open-loop frequency control. In such a modified system, the VCO 124 does not receive a phase error signal. Instead, the VCO 124 is controlled by a separate frequency controller. For example, the frequency controller may be used for frequency sweeping within each pulse to reduce reflected power. Experimental measurements demonstrating the reduction in reflected power using frequency sweeping within each pulse are described below in relation to FIGS. 12 and 13.

Figure 11:
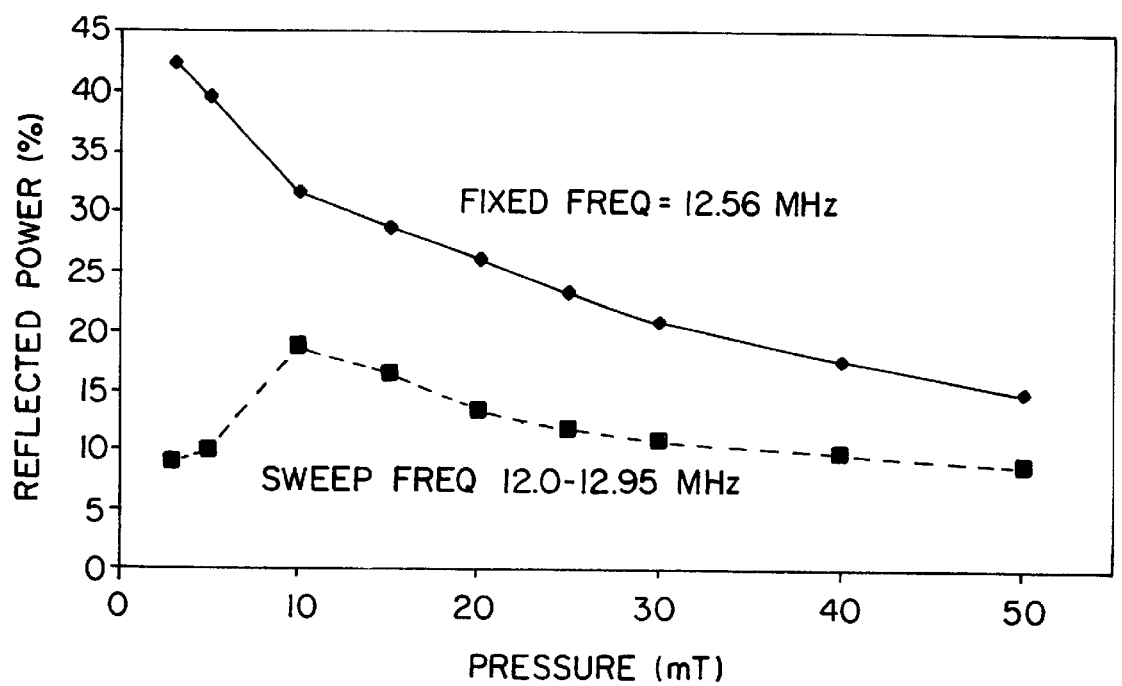
FIG. 11 is a graph of experimental results showing, for a pure $Cl_2$ discharge, a decrease in reflected power during a pulse cycle when frequency is swept linearly rather than being fixed.

FIG. 11 is a graph of experimental results showing, for a pure $Cl_2$ discharge, a decrease in percentage reflected power when frequency is swept linearly during a pulse cycle rather than being fixed. The conditions associated with the experimental results in FIG. 11 are as follows: 100% $Cl_2$; T (pulse)=80 $\mu$s; on-time=35 $\mu$s; rise-time=10 $\mu$s; off-time=45 $\mu$s; and (time averaged) power ~600 w. The pulse period of 80 microseconds comprises a 10 microsecond ramp, followed by a 25 microsecond constant power, followed by a 45 microsecond off-time. The frequency sweeping within a pulse may be achieved using the open-loop frequency control of the VCO 124.

In FIG. 11, the percentage reflected power for various $Cl_2$ gas pressures using fixed 12.56 MHz frequency pulses is shown by the upper data points, and the percentage reflected power for various $Cl_2$ gas pressures using pulses having a frequency swept from 12.0 MHz to 12.95 MHz is shown by the lower data points. For all $Cl_2$ gas pressures shown, the percentage reflected power is always lower when using pulses having swept frequencies rather than pulses having a fixed frequency.

Figure 12:
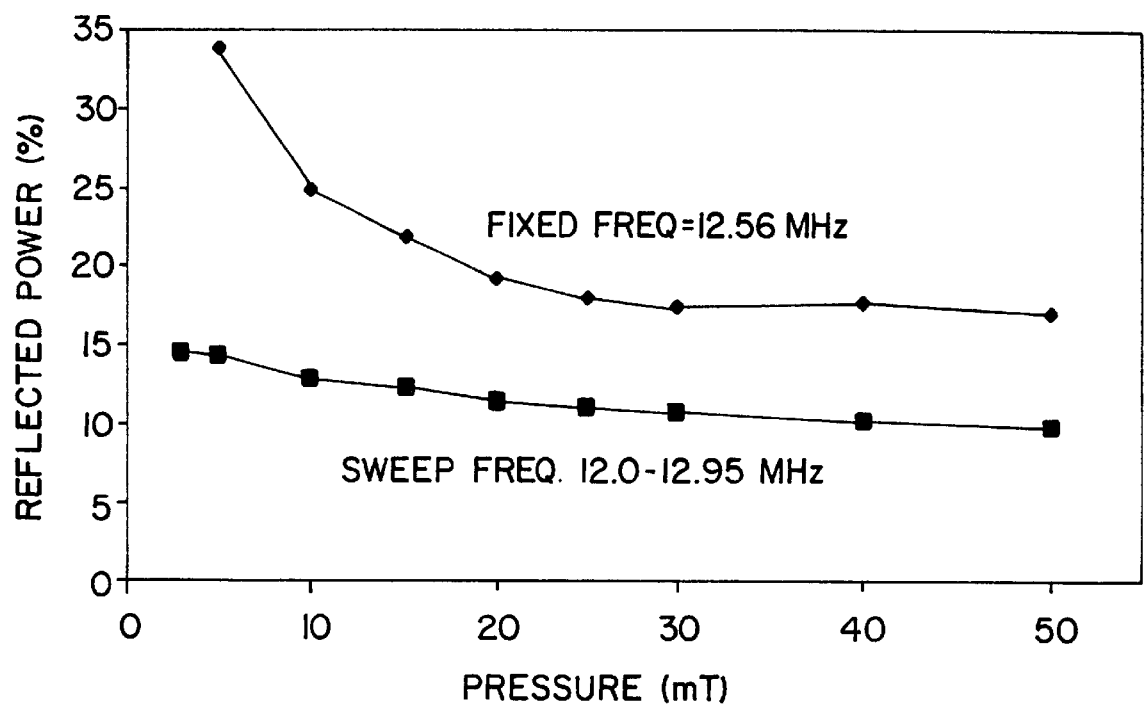
FIG. 12 is a graph of experimental results showing, for a pure HBr discharge, a decrease in reflected power during a pulse cycle when frequency is swept linearly rather than being fixed.

FIG. 12 is a graph of experimental results showing, for a pure HBr discharge, a decrease in reflected power when frequency is swept linearly during a pulse cycle rather than being fixed. The frequency sweeping within a pulse may be achieved using the open-loop frequency control of the VCO 124.

In FIG. 12, the percentage reflected power for various HBr gas pressures using fixed 12.56 MHz frequency pulses is shown by the upper data points, and the percentage reflected power for various HBr gas pressures using pulses having a frequency swept from 12.0 MHz to 12.95 MHz is shown by the lower data points. For all HBr gas pressures shown, the percentage reflected power is always lower when using pulses having swept frequencies rather than pulses having a fixed frequency.

Figure 13:
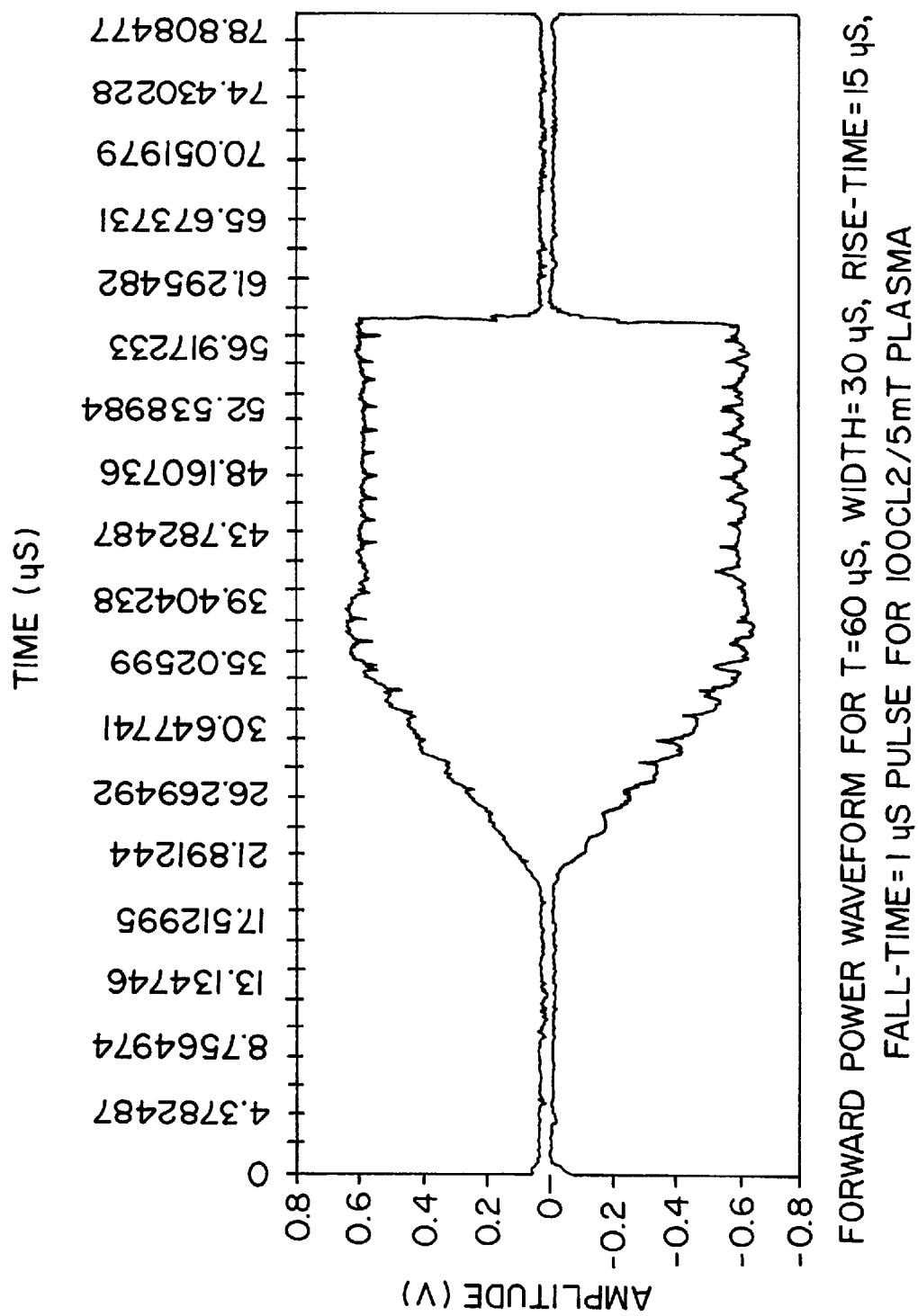
FIG. 13 is a graph showing a forward waveform having ramped power at a leading end of a pulsed waveform in accordance with an embodiment of the present invention.

The results in FIGS. 12 and 13 are generated using a pulse cycle of 80 microseconds comprises a 10 microsecond ramp, followed by a 25 microsecond constant power, followed by a 45 microsecond off time. The on-time is 35 microseconds. The time-averaged power is approximately 600 W.

Figure 2:
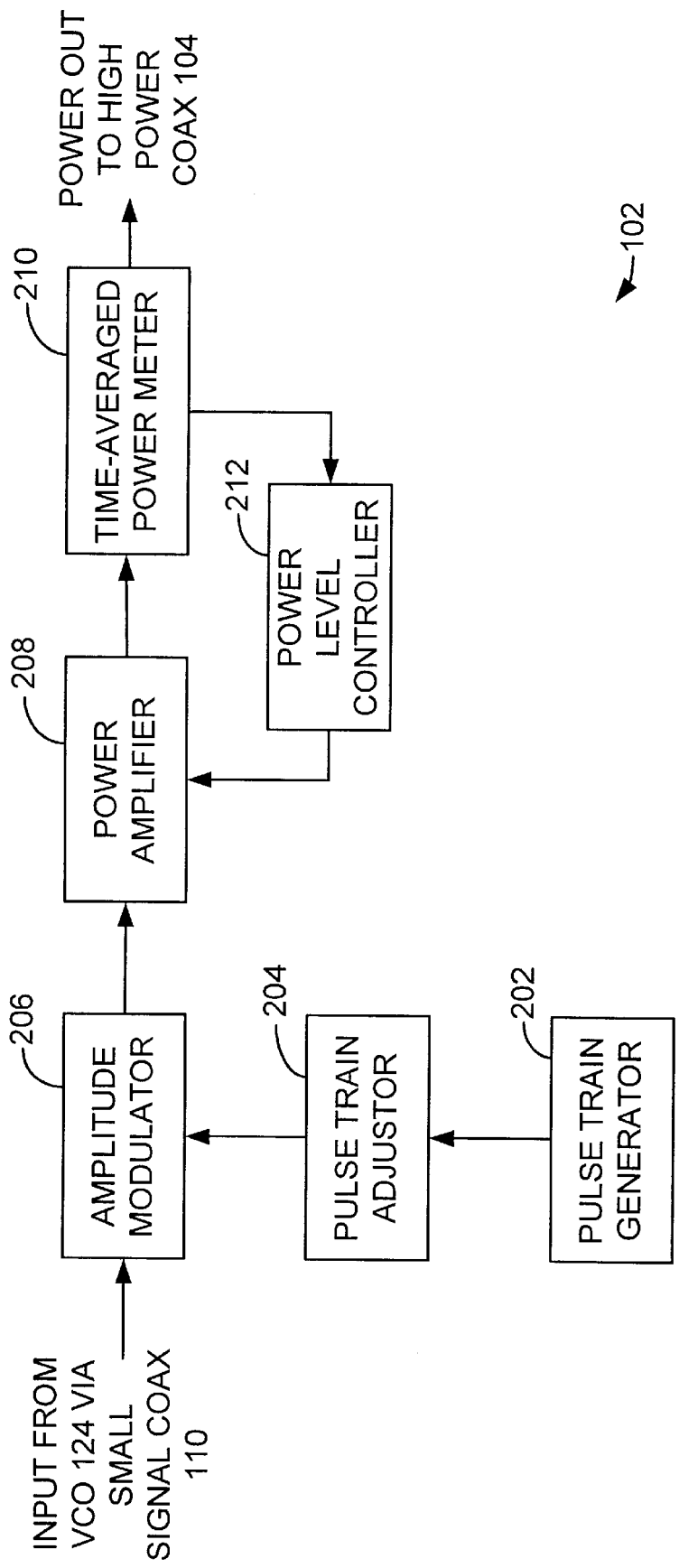
FIG. 2 is a schematic diagram of a pulsed RF power generator 102 in accordance with an embodiment of the present invention.

FIG. 2 is a schematic diagram of a pulsed RF power generator 102 in accordance with an embodiment of the present invention. The pulsed RF power generator 102 includes a pulse train generator 202, a pulse train adjuster 204, an amplitude modulator 206, a power amplifier 208, a time-averaged power meter 210, and a power level controller 212.

The pulse train generator 202 generates a train of pulses and outputs the train of pulses to a pulse train adjuster circuit 204. In one embodiment, pulse trains with variable duty cycles and variable other pulse parameters may be generated by the pulse train generator 202. The pulse train adjuster 204 receives the pulse train and operates to adjust the pulse train before transmitting it to the modulating signal input of the amplitude modulator 206.

The amplitude modulator 206 receives a RF oscillation signal from the VCO 124 and modulates the RF oscillation signal with the pulse train signal. The resultant pulsed RF signal is output by the amplitude modulator 206 to the power amplifier 208. The power amplifier 208 increases the power of the pulsed RF signal to generate a pulsed RF power signal. The pulsed RF power signal is transmitted from the power amplifier 208 through the time-averaged power meter 210 to the high power coaxial cable 104. The power level controller 212 receives time-averaged measures of the power from the meter 210 and uses them to adjust the amplification applied by the power amplifier 208 so as to level the power output.

In a first application of the pulsed RF power generator shown in FIG. 2, the pulse train adjuster 204 ramps the pulse heights to achieve a ramped pulsed power waveform. Such a ramped pulsed power waveform is illustrated in FIG. 13 and results in reduced reflected power.

FIG. 13 is a graph showing a forward waveform having ramped power at a leading end of a pulsed waveform in accordance with an embodiment of the present invention. The generation of the ramped pulse waveform utilizes the train adjuster 206 as described above. The ramped pulse waveform shown in FIG. 13 has a pulse time of 60 microseconds; a width of 30 microseconds; ramp rise time of 15 microseconds, and a fall time of 1 $\mu$s for 100% $Cl_2$/5 mT plasma. The results from using ramped pulse waveforms are described in relation to FIG. 14.

Figure 14:
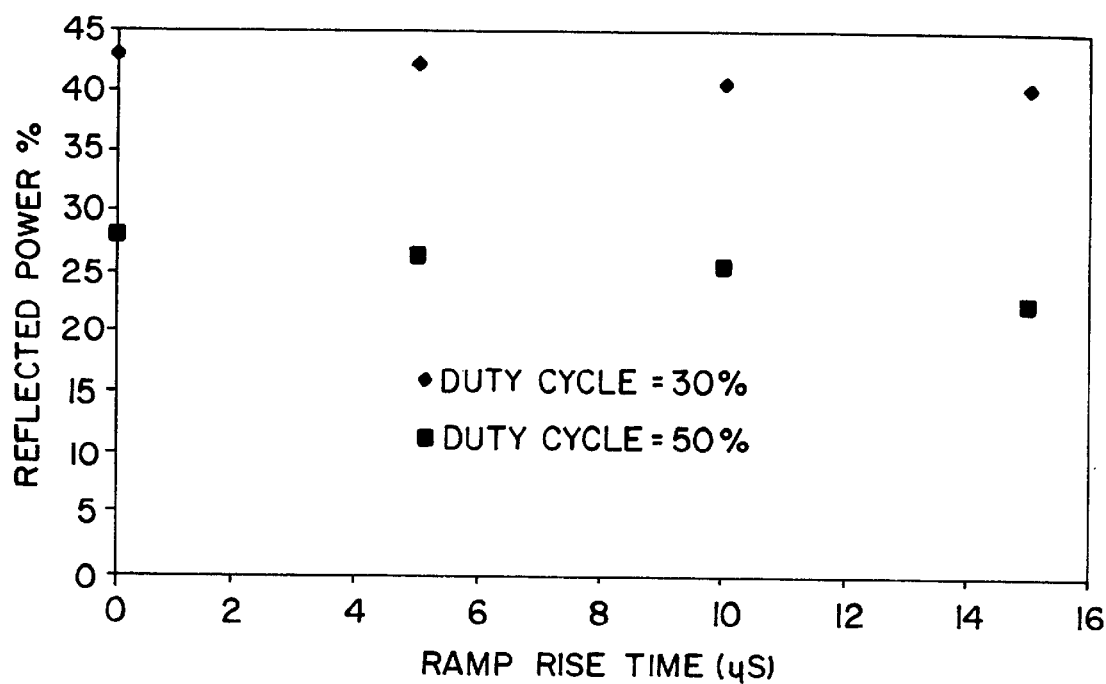
FIG. 14 is a graph of experimental results showing decreasing reflected power as ramp rise time increases.

FIG. 14 is a graph of percent reflected power versus ramp rate at the leading end of a pulse waveform experimental results show decreasing reflected power as ramp rise time increases. Data points are shown for both 30 percent and 50 percent pulse duty cycles. In either case, the percent reflected power is shown to decrease with increasing ramp rise times. Hence, ramping the pulse waveform is shown to reduce reflected power.

In a second application of the pulsed RF power generator shown in FIG. 2, the pulse train adjuster 204 provides a non-zero minimum voltage value for the pulses which corresponds to a relatively low-level CW waveform being transmitted simultaneously with the pulsed waveform. Such simultaneous transmission of a relatively low-level CW waveform and a pulsed waveform is illustrated in FIG. 15 and also results in reduced reflected power.

Figure 15:
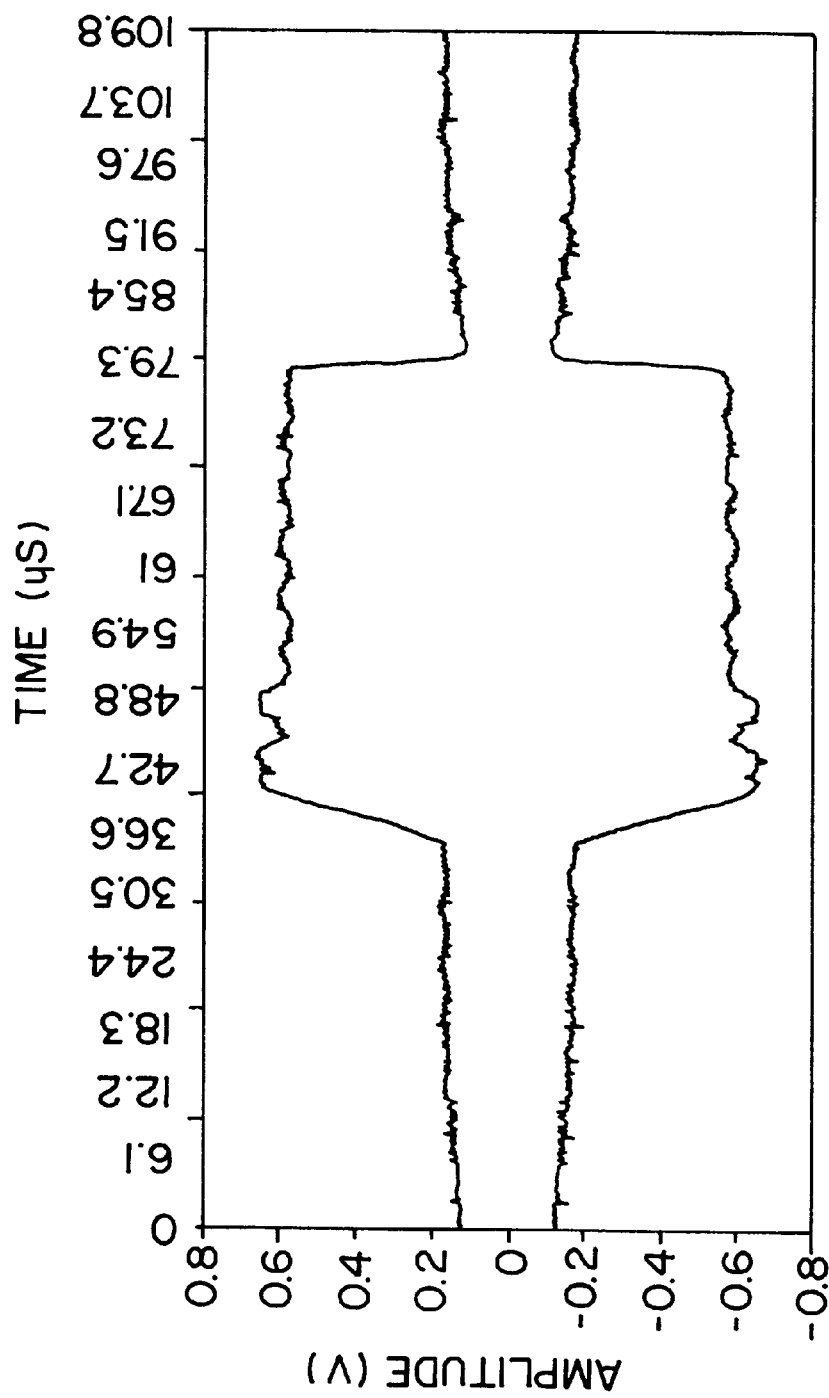
FIG. 15 is a graph showing a forward waveform comprising a low-level of continuous waveform in addition to a pulsed waveform in accordance with an embodiment of the present invention.

FIG. 15 is a graph showing a forward waveform comprising a low-level of continuous waveform in addition to a pulsed waveform in accordance with an embodiment of the present invention. The generation of the combined CW and pulsed waveform utilizes the train adjuster 204 as described above. The combined waveform shown in FIG. 15 has a ratio between the CW power level and pulse peak power level of 7.3%. The following conditions were present: pulse time=80 microseconds; width=35 microseconds; and 100% $Cl_2$/5 mT plasma. The results from using the combined waveform are described below in relation to FIG. 16.

Figure 16:
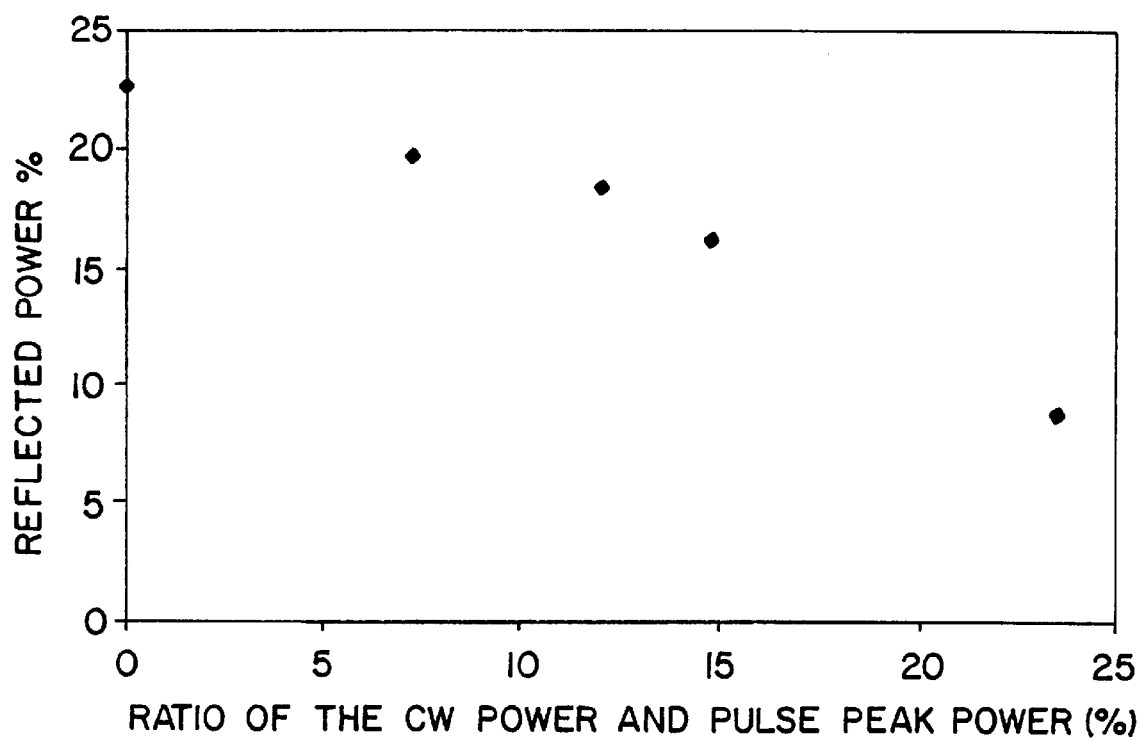
FIG. 16 is a graph of experimental results showing decreasing reflected power as a ratio of continuous waveform power to pulse peak power increases.

FIG. 16 is a graph of experimental results showing decreasing reflected power as a ratio of continuous waveform power to pulse peak power increases. The graph shows reflected power (%) versus the ratio of continuous wave power and pulse power for: T (pulse)=80 $\mu$s; DC(duty cycle)=50% pulse; and a 100% $Cl_2$/5 mT baseline. As shown in FIG. 16, the reflected power percentage decreases from about 22% at a ratio of zero percent to about 10% at a ratio of about twenty-three percent.

Figure 3A:
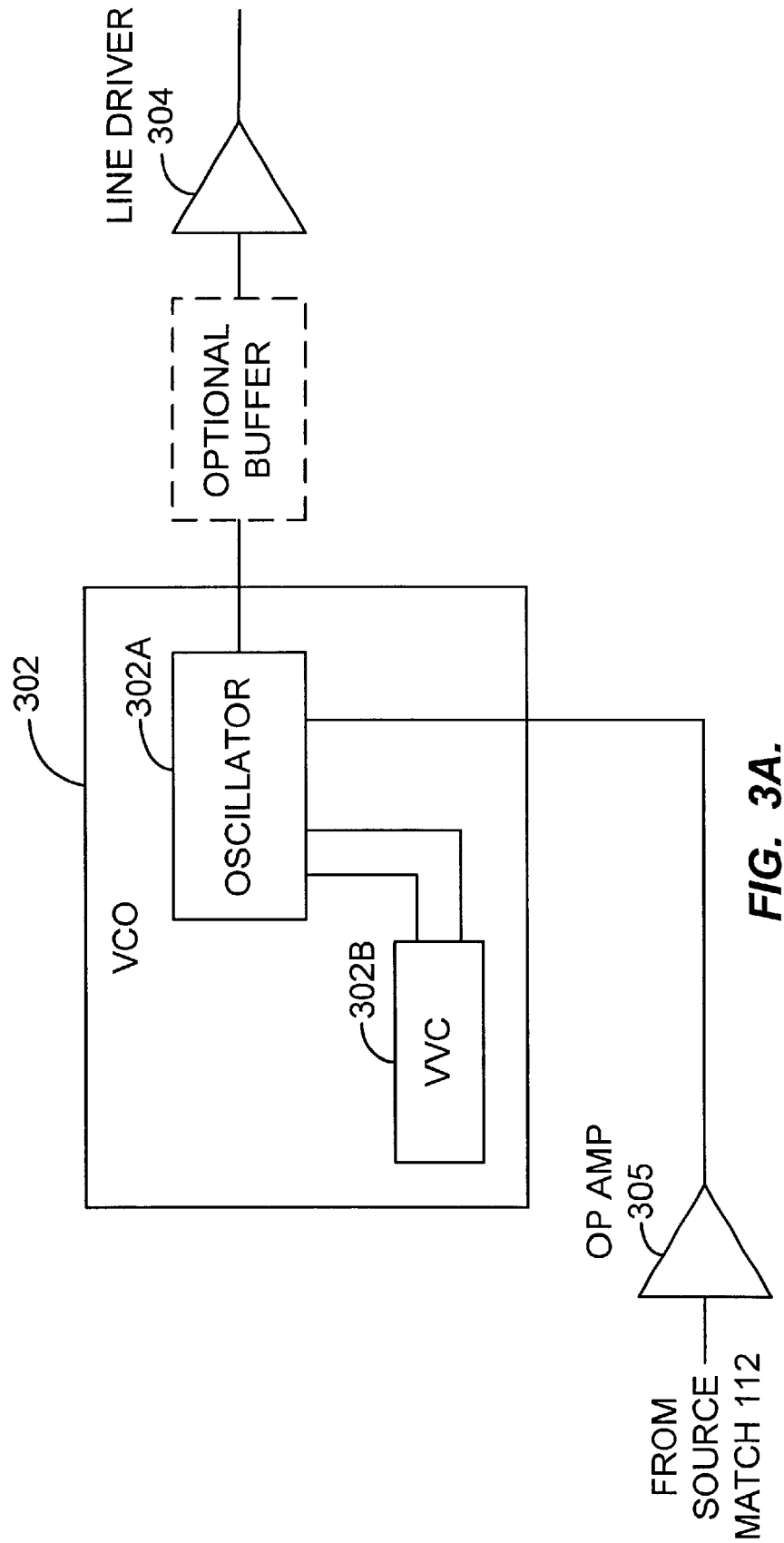
FIG. 3A is a circuit diagram of a first embodiment for the VCO 124 in accordance with the present invention.

FIG. 3A is a circuit diagram of a first embodiment for the VCO 124 in accordance with the present invention. The VCO 124 in FIG. 3A is designed to be compatible with a matching network 122 having variable series 604 and shunt 606 capacitances. The VCO 124 comprises a VCO subcircuit 302 and an amplifier subcircuit 304.

The VCO subcircuit 302 comprises a modified Colpitts oscillator 302A. The frequency of the oscillator is determined by a parallel resonance of the inductance with a capacitance that includes a VVC diode 302B. "VVC" stands for voltage variable capacitance. The phase error signal from 112 is fed through an op amp 305 to bias the VVC. The output of the modified Colpitts oscillator is fed to the amplifier subcircuit 304. The amplifier subcircuit 304 comprises a "line driver" linear amplifier which outputs the amplified signal along the small signal coaxial cable 110 to the pulsed RF generator 102. Optionally, the output is buffered before it is fed to amplifier 304.

Figure 3B:
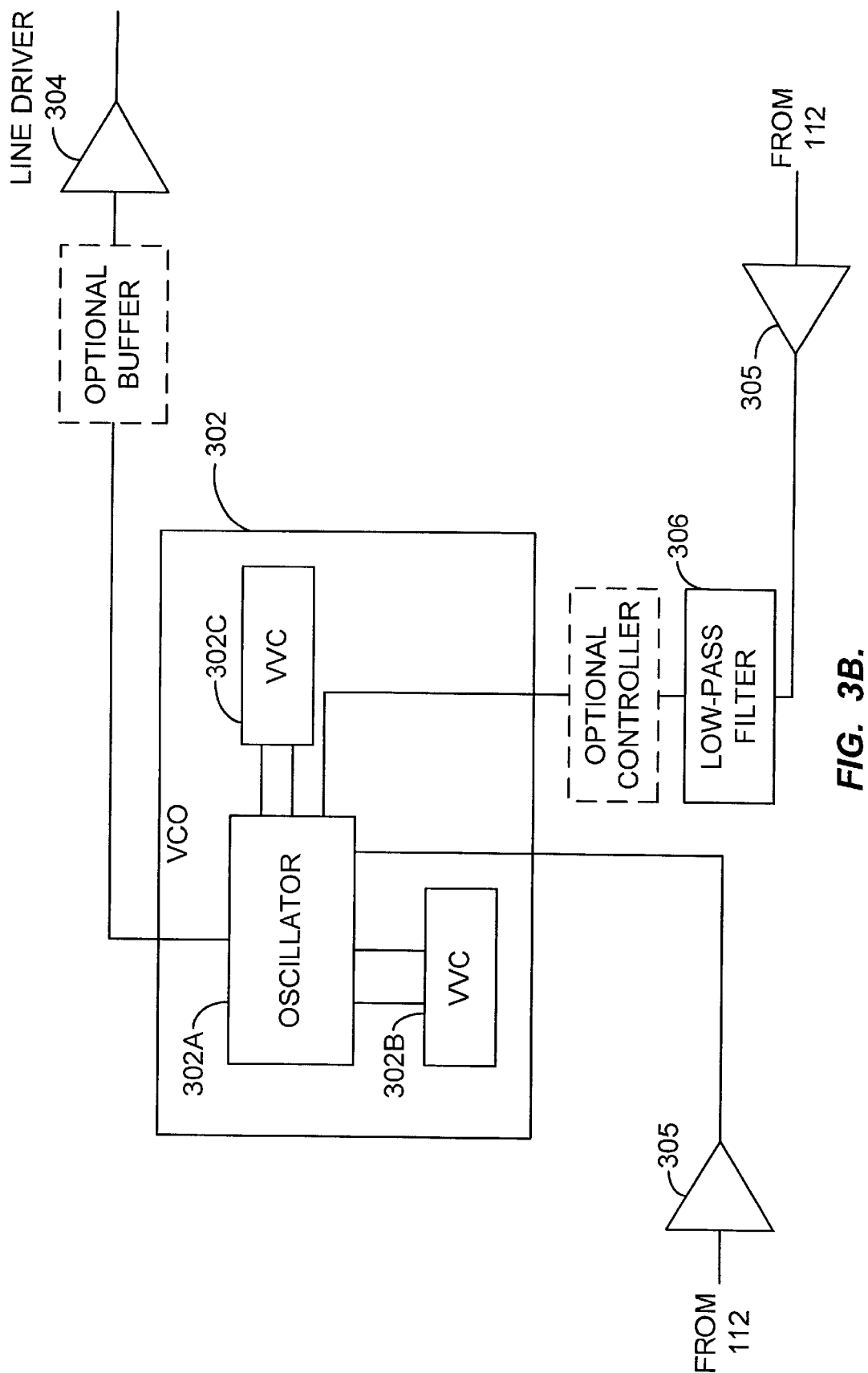
FIG. 3B is a circuit diagram of a second embodiment for the VCO 124 in accordance with the present invention.

FIG. 3B is a circuit diagram of a second embodiment for the VCO 124 in accordance with the present invention. The VCO 124 in FIG. 3B is also designed to be compatible with a matching network 122 having a fixed series capacitor 604 and a variable shunt capacitor 606. The VCO 124 comprises a VCO subcircuit 302.

The VCO subcircuit 302 in FIG. 3B operates somewhat similarly as the VCO subcircuit 302 in FIG. 3A. However, the VCO subcircuit 302 in FIG. 3B includes a second VVC diode 302C being driven by a filtered phase error. A controller circuit may be required between the second VVC diode 302C and the RC filter 306 for the VCO subcircuit 302 to operate properly. Such a controller circuit may comprise a PID control loop or a programmable controller unit.

Figure 4:
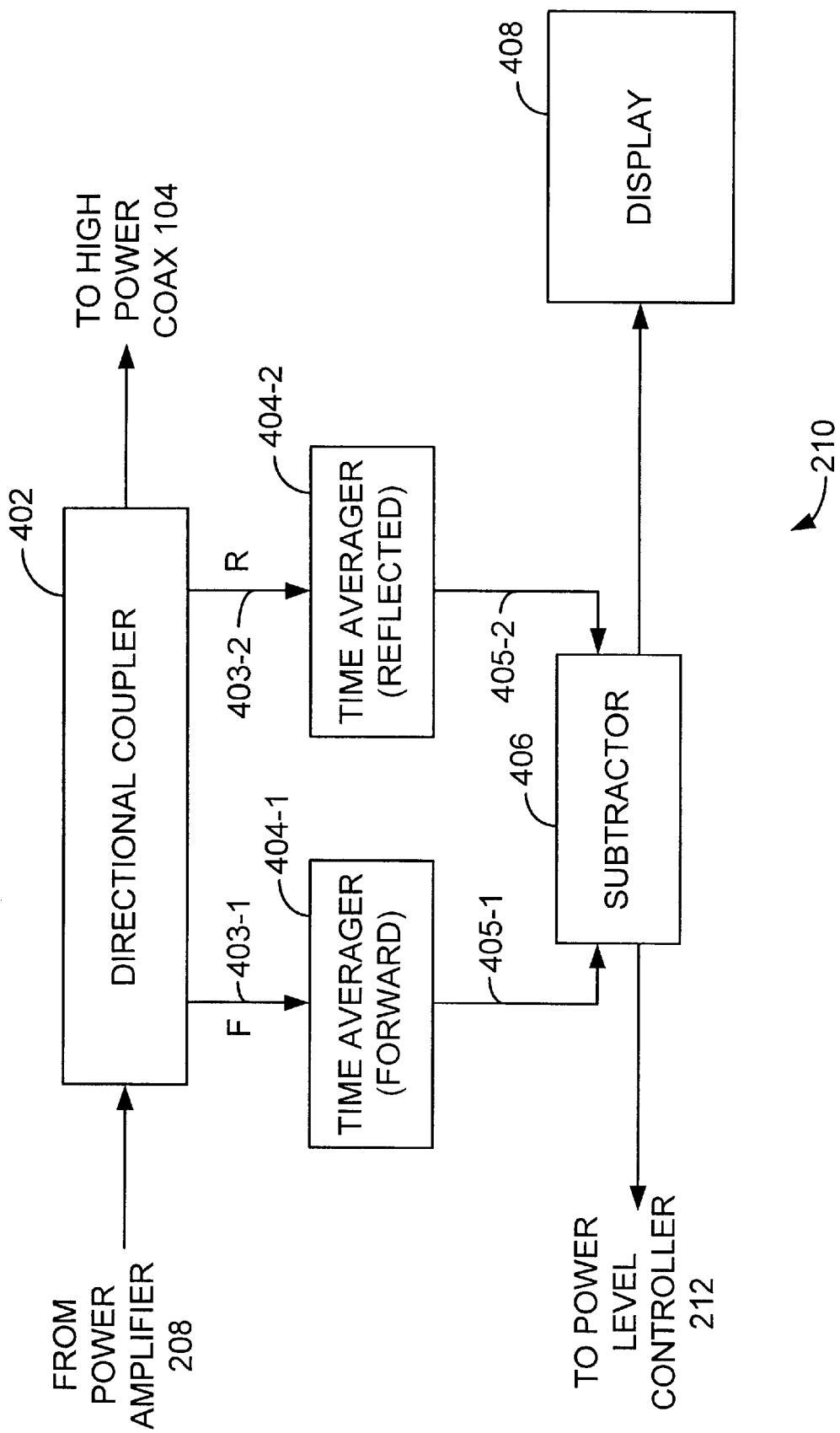
FIG. 4 is a schematic diagram of a time-averaging power meter 210 in accordance with an embodiment of the present invention.

FIG. 4 is a schematic diagram of a time-averaging power meter 210 in accordance with an embodiment of the present invention. The time-averaging power meter 210 includes a directional coupler 402, a time-averager for the forward wave 404-1, a time averager for the reflected wave 404-2, a subtractor circuit 406, and a display 408.

The directional coupler 402 is a bidirectional coupler which generates greatly attenuated versions of the forward (F) and reverse (R) waves from the high power coaxial cable 104 for use by the time-averaging power meter 210. A first (forward) time averager circuit 404-1 receives the attenuated forward wave along a first line 403-1 from the directional coupler 402. Similarly, a second (reverse) time averager circuit 404-2 receives the attenuated reverse wave along a second line 403-2 from the directional coupler 402.

The first time averager circuit 404-1 applies time averaging to the attenuated forward wave to produce a forward power measure and outputs the forward power measure along a first line 405-1 to the subtractor circuit 406. Similarly, the second time averager circuit 404-2 applies time averaging to the attenuated reverse wave to produce a reverse (or reflected) power measure and outputs the reverse power measure along a second line 405-2 to the subtractor circuit 406. Three embodiments for the time averager circuits 404 are described further below in relation to FIGS. 5A–C.

The subtractor circuit 406 operates to subtract the reverse power measure from the forward power measure to produce a measure of the power being absorbed by the plasma in the reaction chamber 108. The absorbed power measure may be sent from the subtractor circuit 406 to the power level controller 212. Further, the power level controller may receive the forward and/or reverse power measures themselves and use them to adjust the amplification of the power amplifier 208.

In addition, the absorbed power measure may be sent from the subtractor circuit 406 to a display 408 for use by an operator monitoring and/or controlling the plasma process in the reaction chamber 108. Further, the display 408 may receive and display the forward and/or reverse power measures themselves. This allows the operator to monitor and/or control the reflected power. Typically, semiconductor manufacturers prefer that the reflected power be no more than 10% of the forward power. Moreover, if the reflected power is too high, the pulsed RF power generator 102 may be detrimentally driven into foldback. The subtractor circuit 406 and display 408 may be implemented using, for example, a Hewlett Packard 438A dual-sensor power meter.

Figure 5A:
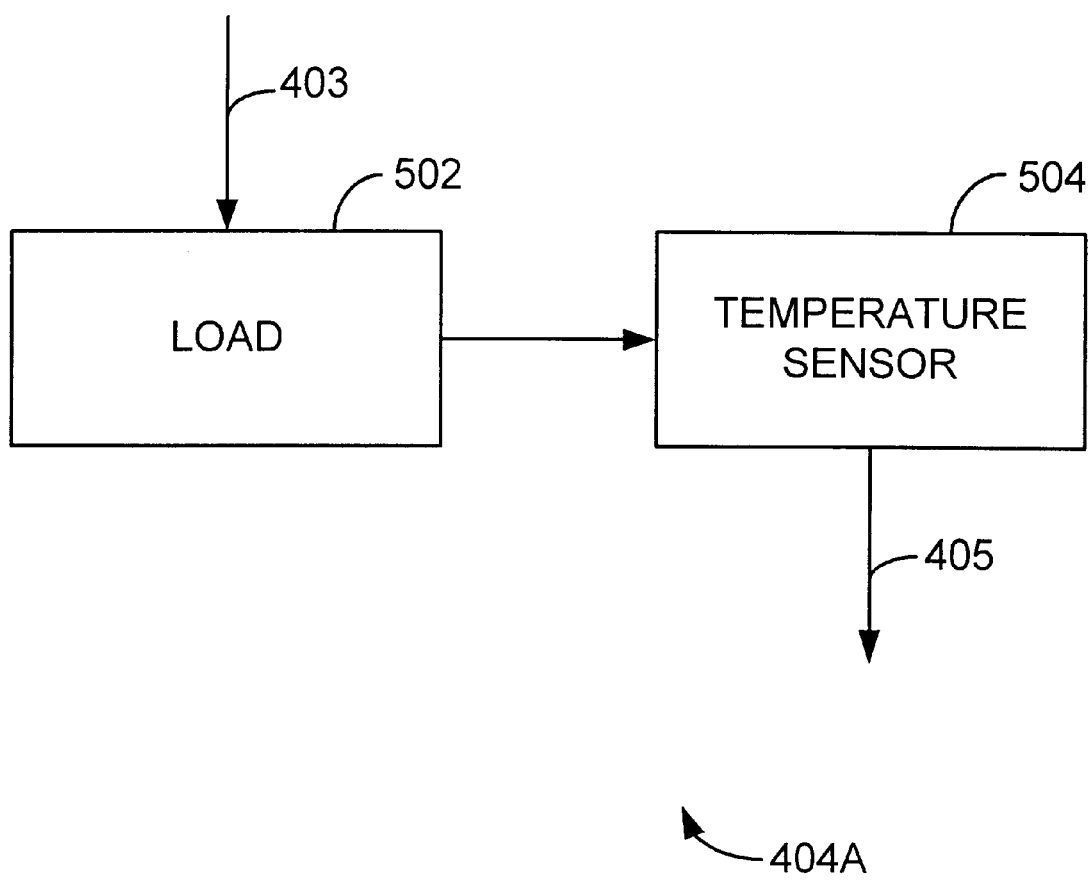
FIG. 5A is a schematic diagram of a temperature-based time averager 404A in accordance with an embodiment of the present invention.

FIG. 5A is a schematic diagram of a temperature-based time averager 404A in accordance with an embodiment of the present invention. The temperature-based time averager 404A may be used for the forward time averager 404-1 and/or the reflected time averager 404-2 in FIG. 4. The temperature-based time averager 404A comprises a load 502 and a temperature sensor 504.

The load 502 comprises a load which converts a low-power signal wave into heat. The conversion into heat provides the time averaging functionality. In one embodiment, the load 502 also comprises a 50 ohm termination to an output of the directional coupler 502. The temperature sensor 504 senses the temperature of the load 502 and outputs an electrical signal indicative of that temperature, and hence indicative of a time-average of the low-power signal wave. In one embodiment, the electrical signal output by the temperature sensor 504 comprises a dc voltage level. Temperature sensors 504 suitable for a test laboratory environment include the Hewlett Packard 848XA family of thermocouple based power sensors. Temperature sensors suitable for commercial application include the Linear Technology LT1088 wideband RMS-DC converter.

Figure 5B:
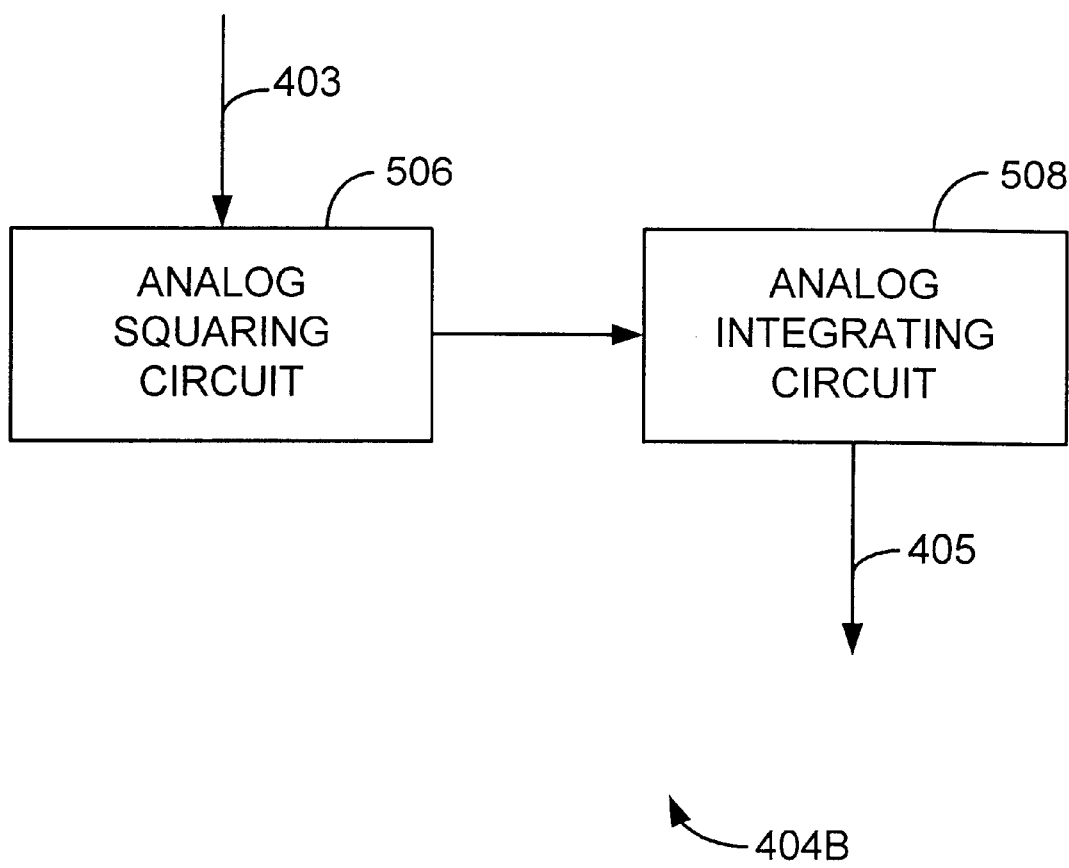
FIG. 5B is a schematic diagram of an analog time averager 404B in accordance with an embodiment of the present invention.

FIG. 5B is a schematic diagram of an analog time averager 404B in accordance with an embodiment of the present invention. The analog time averager 404B may be used for the forward time averager 404-1 and/or the reflected time averager 404-2 in FIG. 4. The analog time averager 404B comprises an analog squaring circuit 506 and an analog integrating circuit 508.

The analog squaring circuit 506 provides the functionality of squaring a time-varying voltage signal V(t). This functionality is useful because the power of a time-varying voltage signal V(t) is proportional to $V^2(t)$ divided by the impedance of the transmission line. In this case, the voltage signal output by the analog squaring circuit 506 is proportional to the square of the voltage signal input into it from the directional coupler 402. Hence, the analog squaring circuit 506 produces an analog voltage signal which is proportional to the power to be measured.

The analog integrating circuit 508 receives the output from the analog squaring circuit 506 and integrates it over time. Thus, the analog integrating circuit 508 time averages the analog power signal.

Figure 5C:
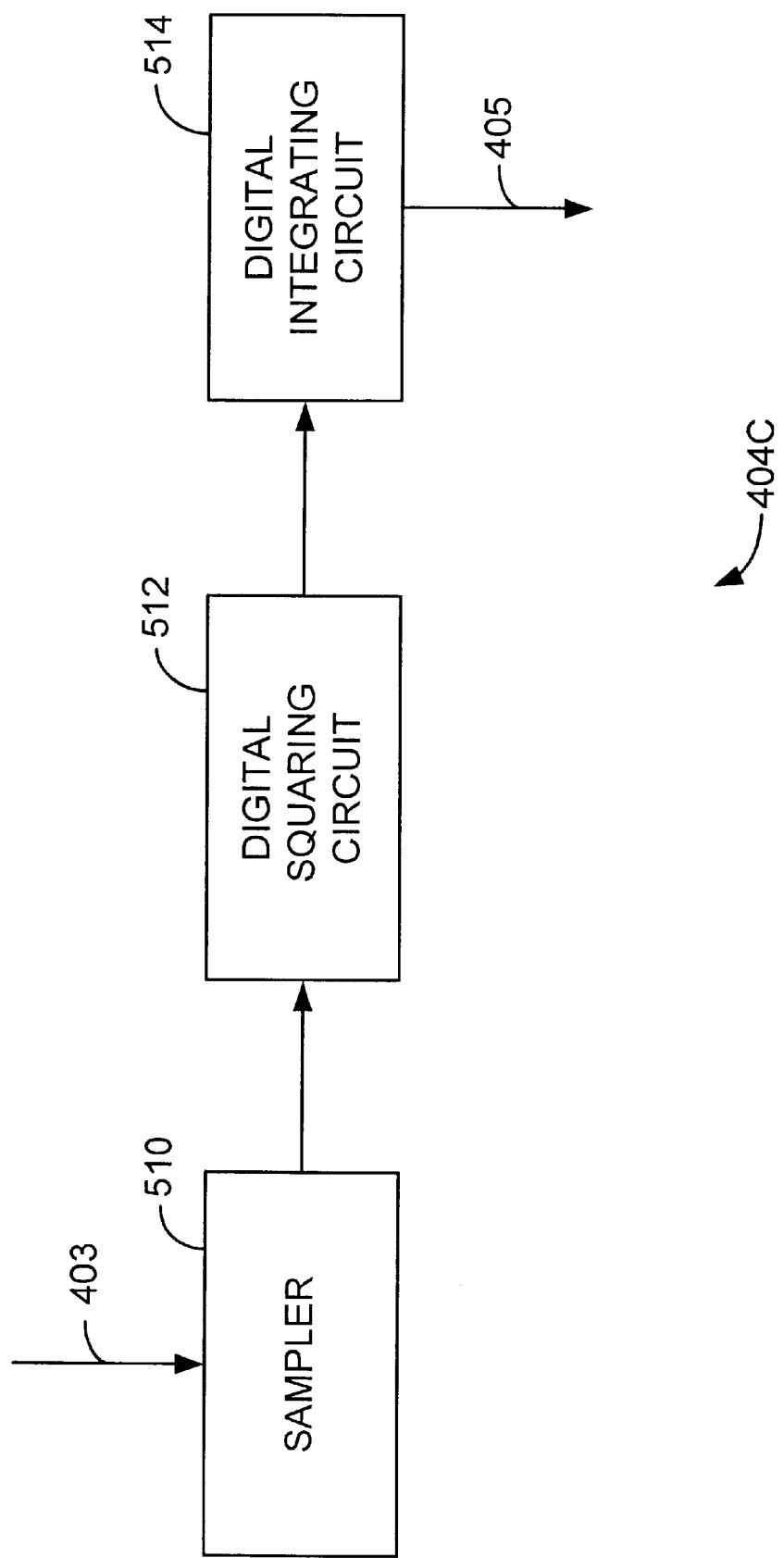
FIG. 5C is a schematic diagram of a digital time averager 404C in accordance with an embodiment of the present invention.

FIG. 5C is a schematic diagram of a digital time averager 404C in accordance with an embodiment of the present invention. The digital time averager 404C may be used for the forward time averager 404-1 and/or the reflected time averager 404-2 in FIG. 4. The digital time averager 404C comprises a sampler 510, a digital squaring circuit 512, and a digital integrating circuit 514.

The sampler 510 receives an analog voltage signal from the directional coupler 402 and samples the analog voltage signal at a finite number of points during each pulse cycle. Preferably, there would be approximately 10 samples per period of the RF wave for good signal reproduction. For example, a 12 megahertz RF wave and a pulse period of 100 microseconds, taking 10 samples per period of the RF wave would require 12,000 samples per pulse period. Such a device may be implemented with current analog-to-digital conversion technology.

The sampled voltage data is output by the sampler 510 to the digital squaring circuit 512. The digital squaring circuit 512 provides the functionality of squaring the sampled voltage data. This functionality is useful because the power of a time-varying voltage signal V(t) is proportional to $V^2(t)$ divided by the impedance of the transmission line. The digital squaring circuit 512 may be implemented using current digital signal processing technology.

The digital integrating circuit 514 receives the squared voltage data from the digital squaring circuit 512 and provides a time-averaging functionality by averaging the squared data over appropriate time periods.

Figure 6:
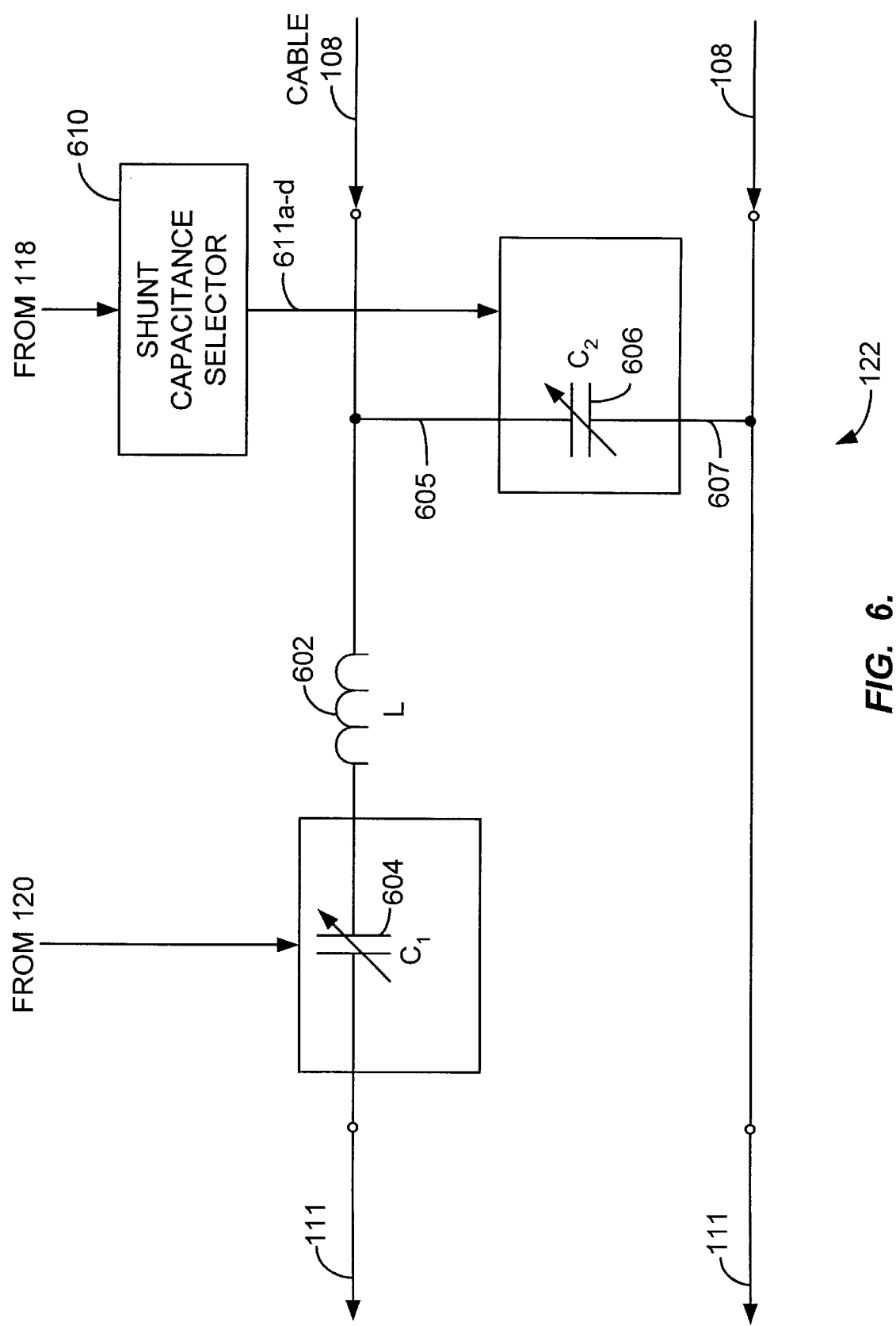
FIG. 6 is a schematic diagram of a local matching network 122 in accordance with an embodiment of the present invention.

FIG. 6 is a schematic diagram of a local matching network 122 in accordance with an embodiment of the present invention. The purpose of the matching network 122 is to adapt the variable impedance of the reactor and plasma discharge to the fixed cable impedance. In unmatched systems, large reactive currents may flow that do not contribute to net power transfer, and standing waves may occur on the transmission line causing unnecessary losses and RF interference. The matching network 122 includes an inductor L 602, a variable series capacitor $C_1$ 604, a variable shunt capacitor $C_2$ 606, and a shunt capacitance selector circuit 610.

The variable series capacitor $C_1$ 604 has its capacitance value controlled by a series capacitor control signal received from the second servo controller 120. In certain embodiments, the series capacitor 604 may have a fixed capacitance (instead of a variable capacitance).

The variable shunt capacitor $C_2$ 606 comprises a capacitance which may be rapidly switched to make rapid adjustments to the impedance of the matching network 122. One embodiment of the variable shunt capacitor $C_2$ 606 comprises a mechanically implemented shunt capacitance. An alternate embodiment of the variable shunt capacitor $C_2$ 606 comprises a PIN diode switched linear capacitor bank which is described in further detail below in relation to FIG. 7. In addition, the variable shunt capacitor $C_2$ 606 may be modified to operate with a binary coded shunt capacitance selector 610.

The variable shunt capacitor $C_2$ 606 is controlled by shunt capacitor selection signals received along lines 611 from the shunt capacitance selector circuit 610. The shunt capacitance selector circuit 610 receives a shunt capacitor control signal from the first servo controller 118. The logical operation of one embodiment of the shunt capacitor selector 610 is described in further detail below in relation to FIG. 18.

Figure 7:
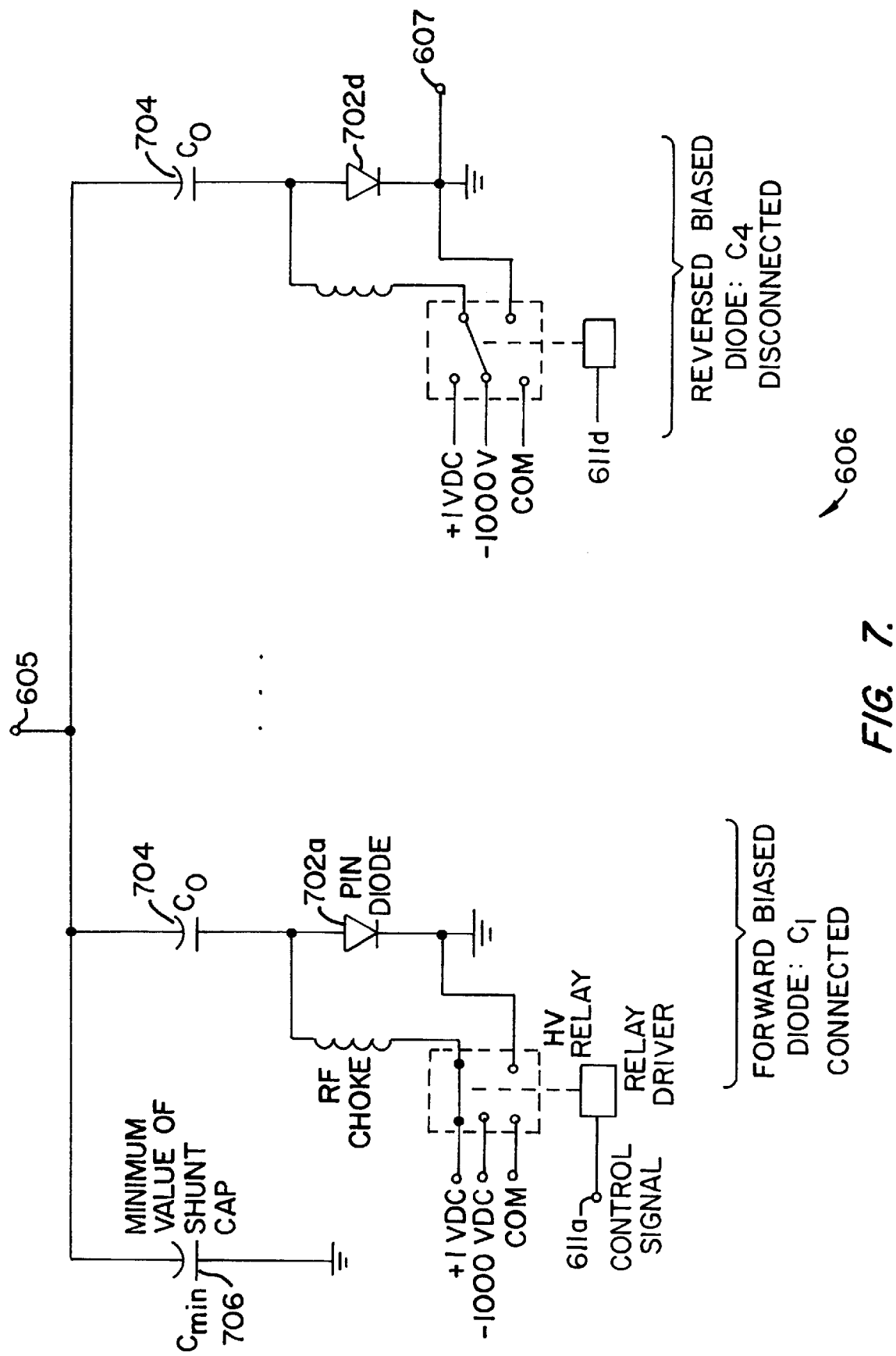
FIG. 7 is a schematic diagram of a linear switch capacitor bank 606 in accordance with an embodiment of the present invention.

FIG. 7 is a schematic diagram of a linear capacitor bank 606 in accordance with an embodiment of the present invention. The linear capacitor bank 606 comprises a plurality of PIN diodes 702, each PIN diode 702 in series with a capacitor Co 704. The PIN diodes 702 are used in this embodiment as switches because of their relatively fast switching speeds.

For example, FIG. 7 shows four PIN diodes 702a–d receiving control signals along four lines 611a–d, respectively. Of course, the use of four PIN diodes in number is for purposes of illustration and is not to be limiting. Depending on the control signals, zero, one, two, three, or four of the PIN diodes 702 may be switched on, varying the capacitance of the linear capacitor bank 606 accordingly. Generally, the capacitance of the bank 606 varies linearly with the number of PIN diodes 702 that are switched on. In addition, the bank 606 may have a minimum value of shunt capacitance due to a fixed capacitor $C_{min}$ 706.

In an alternate embodiment, instead of a linear capacitor bank 606 and selector 610, a binary coded (BCD) capacitor bank and selector may be utilized. Using a binary coded capacitor bank requires different diode switch states than using a linear capacitor bank 606. These different switch states are described below in relation to FIG. 17.

FIG. 17 is a table showing PIN diode switch states for binary coded BCD) and linear capacitance banks. The right side of the table shows the switch states or a five position linear capacitance bank 606 having four switched capacitors Co 704, such as shown in FIG. 7.

The left side of the table shows the switch states for a five bit BCD capacitance bank. The BCD capacitance bank comprises PIN diodes having the following capacitances: the capacitance of the diode corresponding to the second bit is twice the capacitance of the diode corresponding to the first bit; the capacitance of the diode corresponding to the third bit is twice the capacitance of the diode corresponding to the second bit; the capacitance of the diode corresponding to the fourth bit is twice the capacitance of the diode corresponding to the third bit; and the capacitance of the diode corresponding to the fifth bit is twice the capacitance of the diode corresponding to the fourth bit. By selecting the appropriate switch state, any one of 32 different capacitances may be selected from the BCD capacitance bank.

Figure 18:
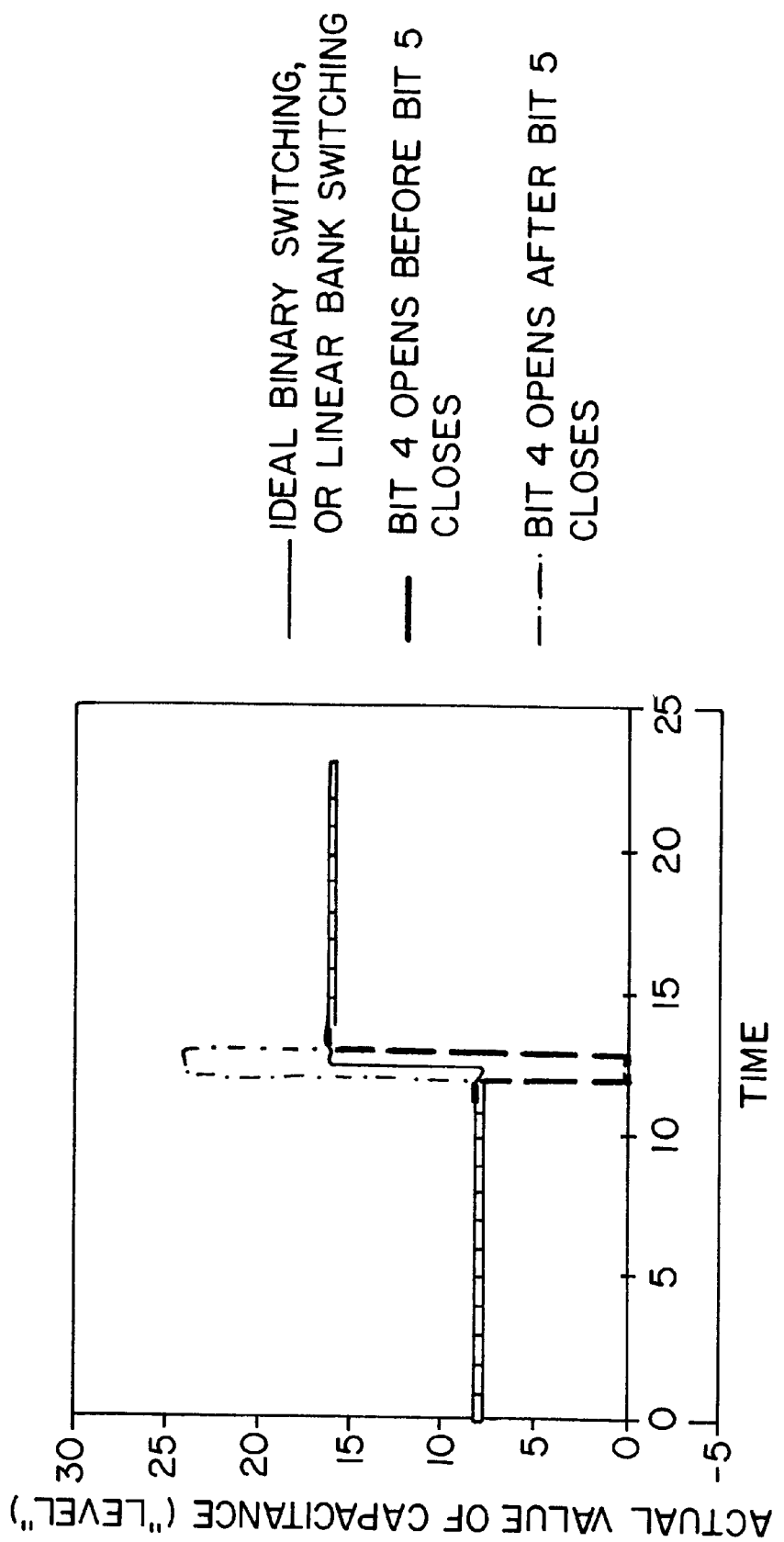
FIG. 18 is a graph showing change in shunt capacitance during linear bank switching and during two scenarios of binary coded bank switching.

FIG. 18 is a graph showing change in shunt capacitance during linear bank switching and during two scenarios of binary coded bank switching. For linear bank switching, the capacitance level transitions directly from 8 to 16 units in the example shown.

In comparison, the binary coded (binary sequenced) bank switching is not so direct. In the example shown, the bank begins with a capacitance level of 8 units corresponding to the binary code being 01000 (only bit 4 is on). The bank ends with a capacitance level of 16 units corresponding to the binary code being 10000 (only bit 5 is on). There are two scenarios for the transition between the two levels. In a first scenario, bit 4 opens (goes to zero) before bit 5 closes (goes to one). In that case, the actual capacitance value drops undesirably to zero (00000) during the transition. In a second scenario, bit 5 closes (goes to one) before bit 4 opens (goes to zero). In that case, the actual capacitance value rises undesirably to twenty-four (11000) during the transition.

Figure 19:
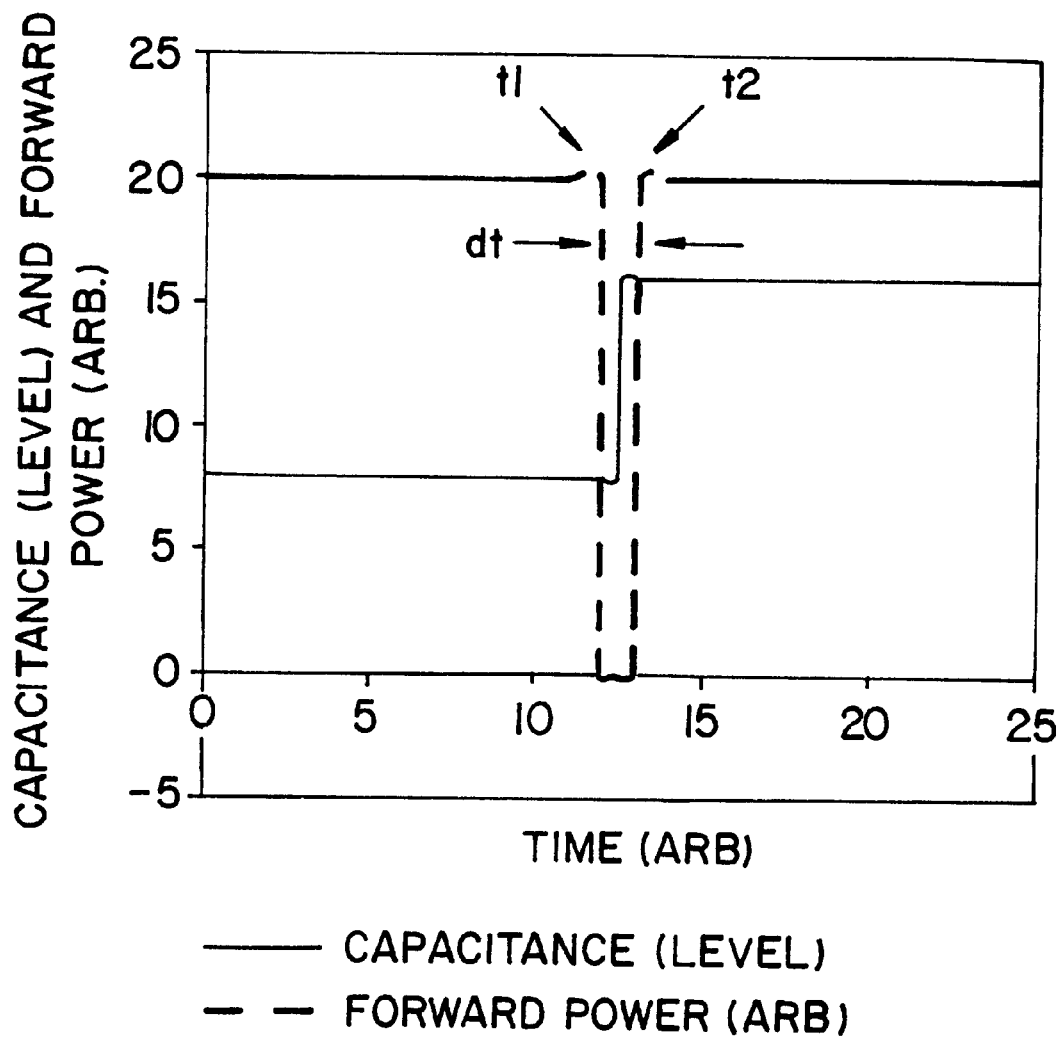
FIG. 19 is a graph showing a scheme for gating of the RF power during bank switching in accordance with an embodiment of the present invention.

FIG. 19 is a graph showing a scheme for gating of the RF power during bank switching in accordance with an embodiment of the present invention. The graph shows a switching scheme for a PIN diode switched shunt capacitor bank, using gating of the RF power to avoid reflected power spikes during the switching transient. The gating technique illustrated in FIG. 19 avoids transient mis-match of RF power which results from the undesirable drops and rises in capacitance during transitions of a binary coded capacitance bank. In this gating technique, the RF power is gated away during a transition in capacitance level such that no RF power is applied to the match while the shunt capacitance bank is switching states. This eliminates any reflected power spikes which would have otherwise been produced during the transition of the shunt capacitor states.

What is claimed is:

1. A method for delivering pulsed RF power to a plasma, the method comprising:

generating a pulse train comprising a series of pulses, each pulse being characterized by a pulse period;

generating a frequency-varied RF oscillation which varies in frequency within the pulse period;

modulating the frequency-varied RF oscillation with the pulse train to generate a frequency-varied pulsed RF signal; and transmitting the frequency-varied pulsed RF signal to the plasma.

2. The method of claim 1 wherein the frequency-varied RF oscillation varies in frequency within the pulse period in accordance with a frequency profile.

3. The method of claim 2 wherein the frequency profile is piecewise linear in frequency variation over time.

4. The method of claim 3 wherein the frequency profile is linear with a first slope over an ignition phase of the pulse period, and then linear with a second slope over a fully developed phase of the pulse period.

5. The method of claim 1 wherein using the frequency-varied pulsed RF signal, instead of a frequency-fixed pulsed RF signal, reduces a percentage of power reflected from the plasma.

6. A method for delivering pulsed RF power to a plasma, the method comprising:

generating a pulse train comprising a series of pulses, each pulse being characterized by a pulse period;

generating a frequency-varied RF oscillation which varies in frequency within the pulse period;

modulating the frequency-varied RF oscillation with the pulse train to generate a frequency-varied pulsed RF signal;

transmitting the frequency-varied pulsed RF signal to the plasma;

sensing a phase error signal comprising a phase difference between the frequency-varied pulsed RF signal being transmitted to the plasma and a reflected signal coming back from the plasma; and utilizing the phase error signal for frequency control over the frequency-varied RF oscillation, wherein the frequency-varied RF oscillation varies in frequency within the pulse period in accordance with a frequency profile.

7. A system for delivering pulsed RF power to a plasma, the system comprising:
- a pulse generator adapted to generate a pulse train comprising a series of pulses, each pulse being characterized by a pulse period;
- a variable-frequency oscillator adapted to generate a frequency-varied RF oscillation which varies in frequency within the pulse period;
- an amplitude modulator adapted to modulate the frequency-varied RF oscillation with the pulse train to generate a frequency-varied pulsed RF signal; and
- a transmission medium adapted to transmit the frequency-varied pulsed RF signal to the plasma.

8. A system for delivering pulsed RF power to a plasma, the system comprising:
- a pulse generator adapted to generate a pulse train comprising a series of pulses, each pulse being characterized by a pulse period;
- a variable-frequency oscillator adapted to generate a frequency-varied RF oscillation which varies in frequency within the pulse period;
- an amplitude modulator adapted to modulate the frequency-varied RF oscillation with the pulse train to generate a frequency-varied pulsed RF signal;
- a transmission medium adapted to transmit the frequency-varied pulsed RF signal to the plasma;
- a phase error sensor coupled to the transmission medium and adapted to sense a phase error signal comprising a phase difference between the frequency-varied pulsed RF signal being transmitted to the plasma and a reflected signal coming back from the plasma; and
- a feedback mechanism adapted to send the phase error signal to a frequency control input of the voltage-controlled oscillator.

9. A method for delivering pulsed radio frequency (RF) power to a plasma, the method comprising:
- generating a RF oscillation;
- generating a pulse train comprising a series of pulses, each pulse being characterized by a pulse height;
- varying the pulse height from pulse to pulse in the pulse train to form a pulse train having varied pulse heights;
- modulating the RF oscillation with the pulse train having varied pulse heights to form a pulsed RF signal having varied pulse heights; and
- transmitting the pulsed RF signal having varied pulse heights to the plasma.

10. The method of claim 9 wherein varying the pulse height from pulse to pulse, instead of having a constant pulse height, reduces a percentage of power reflected from the plasma.

11. A method for delivering pulsed radio frequency (RF) power to a plasma, the method comprising:
- generating a RF oscillation;
- generating a pulse train comprising a series of pulses, each pulse being characterized by a pulse height;
- varying the pulse height from pulse to pulse in the pulse train to form a pulse train having varied pulse heights;
- modulating the RF oscillation with the pulse train having varied pulse heights to form a pulsed RF signal having varied pulse heights; and
- transmitting the pulsed RF signal having varied pulse heights to the plasma,
- wherein varying the pulse height from pulse to pulse comprises ramping the pulse height upward over a plurality of pulses from a smaller value at a leading end of the pulse train to a larger value further into the pulse train.

12. The method of claim 11 wherein the larger value comprises a steady state value.

13. A system for delivering pulsed radio frequency (RF) power to a plasma, the system comprising:
- a RF oscillator adapted to generate a RF oscillation;
- a pulse generator adapted to generate a pulse train comprising a series of pulses, each pulse being characterized by a pulse height;
- a train adjuster adapted to vary the pulse height from pulse to pulse in the pulse train to form a pulse train having varied pulse heights;
- an amplitude modulator adapted to modulate the RF oscillation with the pulse train having varied pulse heights to form a pulsed RF signal having varied pulse heights; and
- a transmission medium adapted to transmit the pulsed RF signal having varied pulse heights to the plasma.

14. A method for delivering pulsed radio frequency (RF) power to a plasma, the method comprising:
- generating a first continuous wave RF signal and a second continuous wave RF signal;
- generating a pulse train comprising a series of pulses;
- modulating the first continuous wave RF signal with the pulse train to form a pulsed RF signal; and
- transmitting simultaneously both the pulsed RF signal and the second continuous wave RF signal to the plasma.

15. The method of claim 14 where transmission of the second continuous wave RF signal begins before transmission of the pulsed RF signal begins.

16. The method of claim 14 where a constant voltage level of the second continuous wave signal is twenty-five percent or less than a maximum voltage of the pulsed RF signal.

17. The method of claim 14 wherein transmitting simultaneously both the pulsed RF signal and the second continuous wave RF signal, instead of transmitting only the pulsed RF signal, reduces a percentage of power reflected from the plasma.

18. A system for delivering pulsed radio frequency (RF) power to a plasma, the system comprising:
- a RF oscillator subsystem adapted to generate a first continuous wave RF signal and a second continuous wave RF signal;
- a pulse generator adapted to generate a pulse train comprising a series of pulses;
- an amplitude modulator adapted to modulate the first continuous wave RF signal with the pulse train to form a pulsed RF signal; and
- a transmission medium adapted to transmit simultaneously both the pulsed RF signal and the second continuous wave RF signal to the plasma.

19. A method for delivering pulsed RF power to a plasma, the method comprising:
- transmitting a pulsed MF signal by way of an impedance matching network to the plasma, the pulsed RF signal including a series of pulses, each pulse being characterized by a pulse period;
- sensing a magnitude error signal related to a magnitude of a reflected signal coming back from the plasma; and
- utilizing the magnitude error signal for control over a variable shunt capacitor in the impedance matching network, where capacitance of the variable shunt capacitor is varied within the pulse period.

20. The method of claim 19 wherein the shunt capacitor transitions from a first capacitance at an end of an ignition phase of the pulse period to a second capacitance at a beginning of a fully developed phase of the pulse period.

21. The method of claim 19 wherein the shunt capacitor comprises a linear capacitor bank.

22. The method of claim 19 wherein varying the capacitance of the variable shunt capacitor within the pulse period, instead of having a constant shunt capacitance within the pulse period, reduces a percentage of power reflected from the plasma.

23. The method of claim 19 further comprising:
performing an etching process using the plasma.

24. A method for delivering pulsed RF power to a plasma, the method comprising:
transmitting a pulsed RF signal by way of an impedance matching network to the plasma, the pulsed RF signal including a series of pulses, each pulse being characterized by a pulse period;
sensing a magnitude error signal related to a magnitude of a reflected signal coming back from the plasma; and
utilizing the magnitude error signal for control over a variable shunt capacitor in the impedance matching network,
where capacitance of the variable shunt capacitor is varied within the pulse period wherein the shunt capacitor comprises a binary coded capacitor bank, and a high-speed switch is used to switch the pulsed RF signal away from being delivered to the plasma while the shunt capacitor transitions from a first capacitance to a second capacitance.

25. The method of claim 24 wherein the high-speed switch comprises a PIN diode.

26. A system for delivering pulsed RF power to a plasma, the system comprising:
an RF power generator adapted to generate a pulsed RF signal, the pulsed RF signal including a series of pulses, each pulse being characterized by a pulse period;
a transmission medium coupled to the RF power generator and adapted to carry the pulsed RF signal;
an impedance matching network coupled between the transmission medium and the plasma;
a variable shunt capacitor within the impedance matching network;
a sensor coupled to the transmission medium and adapted to sense a magnitude error signal related to a magnitude of a reflected signal coming back from the plasma; and
a mechanism adapted to send the magnitude error signal from the sensor to a control input of the variable shunt capacitor, where the magnitude error signal is used to vary capacitance of the variable shunt capacitor within the pulse period.

27. The system of claim 26 further comprising:
an etching chamber coupled to the impedance matching network.

28. A system for delivering pulsed radio frequency (RF) power to a plasma and for measuring power absorbed by the plasma, the system comprising:
a pulsed RF power generator configured to generate forward RF pulses;
a RF cable having a first end coupled to the pulsed RF power generator, the RF cable being adapted to carry the forward RF pulses;
a reaction chamber coupled to a second end of the RF cable, the reaction chamber being adapted to contain the plasma and to couple the forward RF pulses to the plasma;
a directional coupler coupled to the RF cable, the directional coupler being adapted to generate a first attenuated signal proportional to the forward RF pulses and a second attenuated signal proportional to backward RF pulses; and
a time-averaging mechanism coupled to the directional coupler and adapted to time-average the first attenuated signals to generate a first time-averaged signal and to time-average the second attenuated signal to generate a second time averaged signal, where the power absorbed by the plasma is proportional to the difference between the first and second time-averaged signals.

29. The system of claim 28 wherein the time-averaging mechanism comprises:
a first load coupled to the directional coupler, the first load being adapted to receive the first attenuated signal and to generate a first temperature caused by the first attenuated signal; and
a second load coupled to the directional coupler, the second load being adapted to receive the second attenuated signal and to generate a second temperature caused by the second attenuated signal,
where the first time-averaged signal is generated from the first temperature, and the second time-averaged signal is generated from the second temperature.

30. The system of claim 28 wherein the time-averaging mechanism comprises:
a first squaring circuit coupled to the directional coupler, the first squaring circuit being adapted to receive the first attenuated signal and to generate a first squared signal by squaring the first attenuated signal;
a second squaring circuit coupled to the directional coupler, the second squaring circuit being adapted to receive the second attenuated signal and to generate a second squared signal by squaring the second attenuated signal;
a first integrating circuit coupled to the first squaring circuit, the first integrating circuit being adapted to receive the first squared signal and to generate the first time-averaged signal by integrating the first squared signal; and
a second integrating circuit coupled to the second squaring circuit, the second integrating circuit being adapted to receive the second squared signal and to generate the second time-averaged signal by integrating the second squared signal.

31. The system of claim 28 wherein the time-averaging mechanism comprises:
a first sampler coupled to the directional coupler, the first sampler being adapted to receive the first attenuated signal and to generate a first plurality of sampled voltages by sampling the first attenuated signal;
a second sampler coupled to the directional coupler, the second sampler being adapted to receive the second attenuated signal and to generate a second plurality of sampled voltages by sampling the second attenuated signal;
a first calculating circuit coupled to the first sampler, the first calculating circuit being adapted to receive the first plurality of sampled voltages and to generate the first time-averaged signal by squaring and integrating the first plurality of sampled voltages; and
a second calculating circuit coupled to the second sampler, the second calculating circuit being adapted to receive the second plurality of sampled voltages and to generate the second time-averaged signal by squaring and integrating the second plurality of sampled voltages.

32. The system of claim 31 where the first and second plurality of sampled voltages each include at least eight sampled voltages per pulse cycle.

33. A method for delivering pulsed radio frequency (RF) power to a plasma and for measuring power absorbed by the plasma, the method comprising:

generating forward RF pulses;

containing a plasma within a reaction chamber;

transmitting the forward RF pulses to the plasma by way of a transmission medium;

reflecting backward RF pulses from the plasma;

coupling to the transmission medium to generate a first attenuated signal proportional to the forward RF pulses and a second attenuated signal proportional to the backward RF pulses;

applying time-averaging to the first attenuated signal to generate a first time-averaged signal;

applying time-averaging to the second attenuated signal to generate a second time-averaged signal; and forming a difference signal from a difference between the first and second time-averaged signals, where said difference signal is proportional to RF power absorbed by the plasma.

34. An apparatus for delivering and measuring pulsed radio frequency (RF) power to a plasma, the apparatus comprising:

a pulsed RF generator;

a directional coupler coupled to the pulsed RF generator; and a time-averager coupled to the directional coupler, where the time averager measures forward and backward pulsed RF power and produces a signal representative of a time-averaged difference between the forward and backward pulsed RF power.

* * * * *